United States Patent
Kawaguchi et al.

(10) Patent No.: US 8,416,029 B2
(45) Date of Patent: Apr. 9, 2013

(54) TRANSMISSION NOISE SUPPRESSING STRUCTURE AND WIRING CIRCUIT BOARD

(75) Inventors: Toshiyuki Kawaguchi, Tokyo (JP); Kazutoki Tahara, Saitama (JP); Tsutomu Saga, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 0 days.

(21) Appl. No.: 12/671,304

(22) PCT Filed: Aug. 1, 2008

(86) PCT No.: PCT/JP2008/063899
§ 371 (c)(1),
(2), (4) Date: Jan. 29, 2010

(87) PCT Pub. No.: WO2009/017232
PCT Pub. Date: Feb. 5, 2009

(65) Prior Publication Data
US 2010/0201459 A1    Aug. 12, 2010

(30) Foreign Application Priority Data

Aug. 2, 2007   (JP) ................................ 2007-202121
Oct. 25, 2007  (JP) ................................ 2007-277769

(51) Int. Cl.
*H04B 3/28* (2006.01)
*H01P 3/08* (2006.01)

(52) U.S. Cl.
USPC ........................................... 333/12; 333/238

(58) Field of Classification Search .................... 333/12, 333/143, 151, 243, 236, 238
See application file for complete search history.

(56) References Cited

U.S. PATENT DOCUMENTS

| 7,088,201 B2 | 8/2006 | Piernas ........................ 333/116 |
| 8,134,084 B2 * | 3/2012 | Kawaguchi et al. ........... 174/262 |

FOREIGN PATENT DOCUMENTS

| JP | 3-104293 | 5/1991 |
| JP | 10-163636 A | 6/1998 |
| JP | 10-190237 | 7/1998 |
| JP | 10-242602 | 9/1998 |
| JP | 11-097810 A | 4/1999 |
| JP | 2000-101204 A | 4/2000 |
| JP | 2001-68801 | 3/2001 |

(Continued)

OTHER PUBLICATIONS

Taiwanese Office Action, dated Nov. 28, 2011, issued in corresponding Taiwan Patent Application No. 097128961. Total 13 pages, including English Translation.

(Continued)

*Primary Examiner* — Dean O Takaoka
(74) *Attorney, Agent, or Firm* — Ostrolenk Faber LLP

(57) ABSTRACT

The invention provides a transmission noise suppressing structure and a wiring board capable of suppressing a transmission noise transferred through a power supply line, stabilizing a power supply voltage, and reducing signal transmission line cross talk transmitted through the power supply line or a ground layer without being affected by a resistive layer. A transmission noise suppressing structure includes a power supply line and a signal transmission line arranged apart from each other on the same surface; a ground layer arranged apart from the power supply line and the signal transmission line; and a resistive layer arranged apart from the power supply line and the ground layer. The resistive layer has an area (I) which faces the power supply line and an area (II) which does not face the power supply line. The resistive layer and the signal transmission line are apart from each other.

18 Claims, 15 Drawing Sheets

FOREIGN PATENT DOCUMENTS

| | | |
|---|---|---|
| JP | 2003-283073 A | 10/2003 |
| JP | 2006-49496 | 2/2006 |
| JP | 2006-294967 A | 10/2006 |
| JP | 2006-295101 | 10/2006 |

OTHER PUBLICATIONS

Office Action dated Apr. 21, 2011 issued in corresponding Korean Application No. 10-2010-7001861 with English translation (6 pages).

International Search Report dated Sep. 30, 2008, issued in corresponding international application No. PCT/JP2008/063899.

Office Action dated Sep. 4, 2012 issued in corresponding Japanese Patent Application No. 2007-202121 with English translation (6 pages).

Office Action dated Sep. 4, 2012 issued in corresponding Japanese Patent Application No. 2007-277769 with English translation (6 pages).

* cited by examiner

TRANSMISSION NOISE SUPPRESSING STRUCTURE AND WIRING CIRCUIT BOARD

CROSS REFERENCE TO RELATED APPLICATIONS

The present application is a 35 U.S.C. §371 National Phase conversion of PCT/JP2008/063899, filed Aug. 1, 2008, which claims benefit of Japanese Application No. 2007-202121, filed Aug. 2, 2007 and Japanese Application No. 2007-277769, filed Oct. 25, 2007, the disclosures of which are incorporated herein by reference. The PCT International Application was published in the Japanese language.

TECHNICAL FIELD

The present invention relates to a conductive noise suppressing structure and a wiring circuit board including the conductive noise suppressing structure.

BACKGROUND OF THE INVENTION

In recent years, with the development of a ubiquitous society, electronic apparatuses such as information processing apparatuses (servers, workstations, PCs, game consoles, etc.) and communication apparatuses (cellular phone, etc.) have improved in a signal transmission rate due to the optical/electric conversion of an optical module and have been miniaturized. Moreover, high speed, multi-functionality, and complexity of MPUs (Microprocessor Units) have been realized in servers, workstations, PCs, cellular phones, and game consoles. High speed has been realized in recording apparatuses (memory, etc.).

However, a problem with a malfunction in these apparatuses or other electronic apparatuses may arise due to a noise transmitted from these apparatuses or a noise caused in a conducting member of an apparatus. Examples of the noise include a noise caused due to impedance mismatch with a signal transmission line of a wiring circuit board in a laser diode, a photodiode, the MPU, an electronic component, or the like, cross talk between signal transmission lines, and a noise caused by parallel plate resonation between a power supply line and a ground layer by simultaneous switching of a semiconductor device such as the MPU.

The following wiring circuit boards were suggested to suppress these noises:

(i) a wiring circuit board which includes a power supply layer and a ground layer used to supply a power source to electronic components mounted on the surface thereof, wherein the power supply layer is configured as a laminated structure with a low resistant conductive layer and a high resistant conductive layer of a wiring circuit (Patent Document 1); and (ii) a wiring circuit board (printed wiring board) which has a parallel flat plate structure with a power supply layer and a ground layer, wherein the power supply layer or the ground layer is incorporated with a resistivity conductive film and an electronic component current supply pattern and the thickness of the resistivity conductive film is set to 1/10 or less of that of the electronic component current supply pattern (Patent Document 2).

Both the wiring circuit boards of (i) and (ii) suppress the variation in the power supply voltage by connecting a high resistant loss layer (the high resistant conductive layer or the low resistant conductive film) to the power supply layer, losing the high-frequency current (transmission noise) flowing in the power supply layer, and inhibiting the parallel flat plate resonance between the power supply layer and the ground layer.

However, the high resistant loss layer connected to the power supply layer occupies a large area. Since the wiring circuit board of an electronic apparatus is packaged with a high density in effect, a signal transmission line is also present in the vicinity of the power supply line where the power supply layer is circuit-patterned. For this reason, when the high resistant loss layer is disposed to be connected to the power supply line, problems may arise in that the quality of a signal waveform easily deteriorates, such as cross talk in the signal transmission line, delay of signal transmission, or non-exceeding of a threshold value caused due to reduction in a voltage. Accordingly, the wiring circuit boards of (i) and (ii) may not be realized in practice.

[Patent Document 1] Japanese Laid-Open Patent Application No. 2003-283073

[Patent Document 2] Japanese Laid-Open Patent Application No. 2006-49496

DISCLOSURE OF THE INVENTION

Problems to be Solved by the Invention

The invention provides: a transmission noise suppressing structure capable of suppressing a transmission noise transferred through a power supply line, stabilizing a power supply voltage, and reducing signal transmission line cross talk transmitted through a power supply line or a ground layer without being affected by a resistive layer; and a wiring circuit board including the transmission noise suppressing structure.

Means to Solve the Problems

A transmission noise suppressing structure according to the invention includes: a power supply line and a signal transmission line which are disposed apart from each other on the same surface; a ground layer which is disposed apart from the power supply line and the signal transmission line so as to face the power supply line and the signal transmission line; and a resistive layer which is disposed apart from the power supply line and the ground layer so as to face the power supply line and the ground layer. The resistive layer has an area (I) which faces the power supply line and an area (II) which does not face the power supply line. The resistive layer and the signal transmission line are apart from each other in a width direction of the power supply line.

In the transmission noise suppressing structure according to the invention, it is preferable that a width $W1$ of the power supply line in the width direction of the power supply line and a width $W2$ of the resistive layer in the width direction of the power supply line satisfy Expression (1-1), $$W1 < W2 \qquad (1\text{-}1), \text{ or}$$

a width $W1$ of the power supply line in the width direction of the power supply line and a width $W2$ of the resistive layer in the width direction of the power supply line satisfy Expression (1-2), $$W1 \geq W2 \qquad (1\text{-}2).$$

The transmission noise suppressing structure according to the invention may further include a ground line which is disposed between the power supply line and the signal transmission line adjacent to each other. It is preferable that a width $D$ of a gap between the resistive layer and the signal transmission line in the width direction of the power supply line and an inter-line distance L2 between the ground line and the signal transmission line in the width direction of the power supply line satisfy Expression (2), $$D > L2 \quad (2).$$

In the transmission noise suppressing structure according to the invention, it is preferable that a width D of a gap between the resistive layer and the signal transmission line in the width direction of the power supply line, a distance T between the power supply line and the resistant layer in a thickness direction of the power supply line, the width W1 of the power supply line, and a distance L between the power supply line and the signal transmission line in the width direction of the power supply line satisfy Expression (3), $$3T \leq D < (L+W1) \quad (3).$$

It is preferable that the resistive layer is disposed between the power supply line and the ground layer, and a distance T between the power supply line and the resistant layer in a thickness direction of the power supply line and a distance Tg between the ground layer and the resistive layer in the thickness direction of the power supply line satisfy Expression (4), $$T < Tg \quad (4).$$

It is preferable that a distance T between the power supply line and the resistant layer in a thickness direction of the power supply line is in the range from 2 to 100 μm.

It is preferable that the resistive layer is a layer formed by a physical vapor deposition and having a thickness of 5 to 300 nm.

A wiring circuit board according to the invention includes the transmission noise suppressing structure according to the invention.

Effects of the Invention

A transmission noise suppressing structure and a wiring circuit board according to the invention is capable of suppressing a transmission noise of a power supply line, stabilizing a power supply voltage, and reducing signal transmission line cross talk transmitted through the power supply line or a ground layer without being affected by a resistive layer.

BRIEF DESCRIPTION OF THE REFERENCE SYMBOLS

| | |
|---|---|
| 10: | Transmission noise suppressing structure |
| 11: | Power supply line |
| 12: | Signal transmission line |
| 13: | Ground layer |
| 14: | Resistive layer |
| 15: | Insulating layer |
| 16: | Ground line |
| 20: | Transmission noise suppressing structure |
| 30, 40: | Transmission noise suppressing structure |
| 22: | Signal transmission line |
| 24, 44: | Resistive layer |
| 115: | Gap |
| 18: | Third insulating layer |
| 19: | Fourth insulating layer |
| 19a: | First insulating layer |
| 19b: | Second insulating layer |

DETAILED DESCRIPTION OF THE INVENTION

In the specification, the term "facing" means a state where at least parts overlap with each other when viewed from the upper surface.

In the specification, the width direction of a power supply line is referred to as "an X direction", the length direction of the power supply line is referred to as "a Y direction", and the thickness direction of the power supply line is referred to as "a Z direction".

<Transmission Noise Suppressing Structure>

First Embodiment

Figure 1:
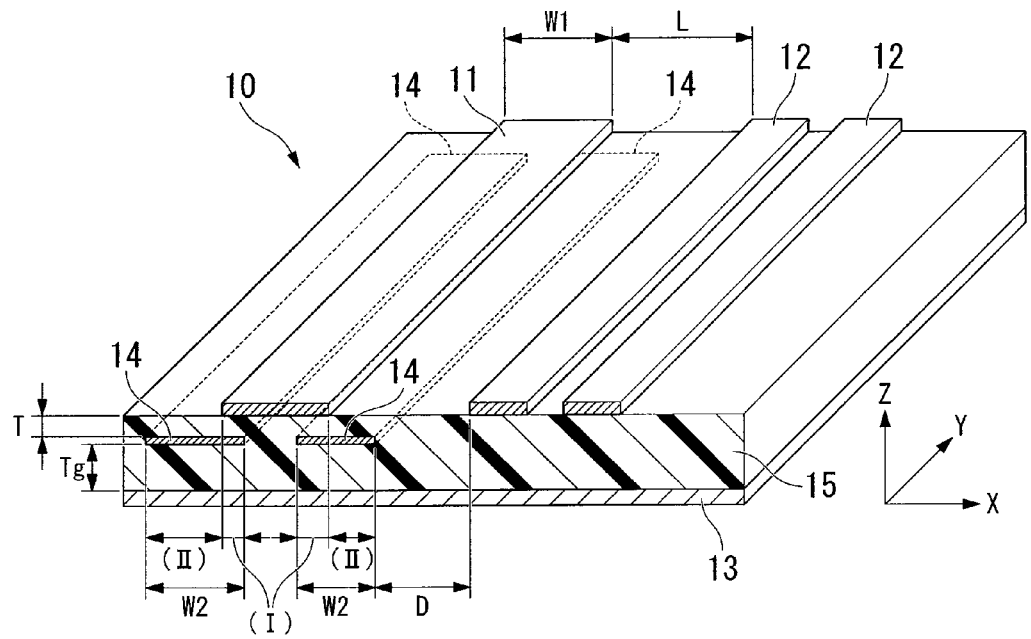
FIG. 1 is a perspective view illustrating the cross section of a transmission noise suppressing structure according to a first embodiment of the invention.

FIG. 1 is a perspective view illustrating the cross section of a transmission noise suppressing structure according to a first embodiment of the invention.

A transmission noise suppressing structure 10, which is a double-side board, includes: a power supply line 11 and two signal transmission lines 12 arranged apart from each other side by side in a Y direction on the front surface (the same surface) of the board; a surface ground layer 13 disposed apart from the power supply line and the signal transmission lines so as to face the power supply line 11 and the signal transmission lines 12 with an insulating layer 15 interposed therebetween and covering the entire rear surface of the board; and two resistive layers 14 arranged in the Y direction apart from the power source line and the ground layer so as to face the power source line 11 and the ground layer 13 with the insulating layer 15 interposed therebetween.

The two resistive layers 14 are disposed apart on the same surface. The resistive layers 14 each have an area (I) which faces the power supply line 11 and an area (II) which does not face the power supply line 11. The resistive layers 14 are disposed apart from the signal transmission lines 12 in an X direction.

In the transmission noise suppressing structure 10, a width W1 of the power supply line 11 in the X direction and a width W2 of each resistive layer 14 in the X direction satisfy Expression (1-2).

$$W1 \geq W2 \tag{1-2}$$

When a part of the resistive layer 14 faces the power supply line 11 in the area (I), a transmission noise of the power supply line 11 can be suppressed, and thus it is preferable that the area of the resistive layer 14 is as small as possible to improve the packaging density of the wiring circuit board. Therefore, it is preferable that the width of each resistive layer 14 is equal to or smaller than the width of the power supply line 11.

In the transmission noise suppressing structure 10, it is considered that a high-frequency noise current (transmission noise) flowing in the power supply line 11 is suppressed as follows.

That is, since the high-frequency noise current flowing in the power supply line 11 flows mainly in the edge end of the power supply line 11, the magnetic flux generated by the high-frequency noise current spreads outward from the edge end of the power supply line 11 and thus some of the magnetic flux links with the resistive layers 14. For this reason, the resistive layers 14 and the power supply line 11 are connected to each other in a magnetic coupling manner. Therefore, when the magnetic flux density linking with the resistive layers 14 is changed, the eddy current is generated in the resistive layers 14 so that the reverse magnetic flux density cancelling the change in the magnetic flux density occurs. It is considered that the current flowing in the resistive layers 14 is converted into heat due to the resistance and thus the energy of the high-frequency noise current flowing in the power supply line 11 suffers a loss.

From the mechanism, it is necessary to dispose the resistive layers 14 so as to face the edge end (that is, a portion in which the magnetic flux density is changed) of the power supply line 11. Even when the resistive layer 14 is disposed directly below a portion (for example, a portion in which the resistive layers 14 are separated from each other in FIG. 1) of the middle of the power supply line 11, a transmission noise suppressing effect is not achieved.

Accordingly, in order to dispose the resistive layers 14 so as to face the edge ends of the power supply line 11, the resistive layers 14 are required to have the area (I) which faces the power supply line 11 and the area (II) which does not face the power supply line 11.

In this case, when the resistive layers 14 are present between the signal transmission lines 12 and the ground layer 13, signals transmitted through the signal transmission lines 12 are also suppressed. Therefore, as shown in FIG. 1, it is necessary to avoid disposing the resistive layers 14 at the positions facing the signal transmission lines 12. The high-frequency noise current flows in the resistive layers 14, and thus an electromagnetic field is radiated from the resistance layer 14, particularly, from the edge end of the resistance layer 14. Therefore, when the signal transmission line 12 exists in the vicinity of the resistance layer 14, the high-frequency noise current of the power supply line 11 may affect the signal transmission line 12 through the resistance layer 14. For this reason, it is necessary to separate the edge end of the resistance layer 14 from the edge end of the signal transmission line 12.

In the transmission noise suppressing structure 10, it is preferable that a width D of the gap between the resistant layer 14 close to the signal transmission line 12 and the signal transmission line 12 close to the resistance layer 14 in the X direction, a distance T between the power supply line 11 and the resistance layer 14 in the Z direction, the width W1 of the power supply line 11 in the X direction, and a distance L between the power supply line 11 and the signal transmission line 12 close to the power supply line 11 in the X direction satisfy Expression (3).

$$3T \leq D < (L+W1) \tag{3}$$

When the width D is smaller than a distance 3T, the transmission noise transferred through the power supply line 11 is easily transferred to the signal transmission line 12. The signal transmission line 12 has a microstrip structure and has a configuration with impedance to be decided. Therefore, when the signal transmission line is close to the resistance layer 14, the impedance of the signal transmission line 12 is changed. For this reason, in order to minimize the influence of the change in the impedance, it is preferable that the width D is equal to or larger than the distance 3T.

On the assumption that the width D is equal to or larger than (L+W1), the power supply line 11 and the resistant layer 14 do not face each other. With such a configuration, since the change in the magnetic flux density occurring in the edge ends of the power supply line 11 cannot be captured in the resistant layer 14, the transmission noise suppressing effect obtained by providing the resistant layer 14 is completely lost.

In terms of the transmission noise suppressing effect, it is preferable that the width D is smaller than the distance L.

In the transmission noise suppressing structure 10, it is preferable that the distance T between the power supply line 11 and the resistant layer 14 in the Z direction and a distance Tg between the ground layer 13 and the resistant layer 14 in the Z direction satisfy Expression (4).

$$T < Tg \tag{4}$$

As for the insulating layer 15 existing between the power supply line 11 and the ground layer 13, the transmission noise suppressing effect is improved by disposing the resistant layers 14 so that the resistive layer 14 is closer to the power supply line 11 than the ground layer 13.

The distance T is preferably in the range from 2 to 100 μm and more preferably in the range from 5 to 50 μm depending on the thickness of the board. When the distance T is smaller than 2 μm, it is difficult to maintain the insulating property. For example, when power supply lines having different voltages are disposed close to each other, an inappropriate leak may occur. When the distance T is larger than 100 μm, the transmission noise suppressing effect becomes weak in that the change in the magnetic flux density from the power supply line 11 is weakened.

The distance L is preferably in the range from 10 to 5000 μm and more preferably in the range from 100 to 1000 μm, even though this distance depends on an individual pattern design.

Second Embodiment

Figure 2:
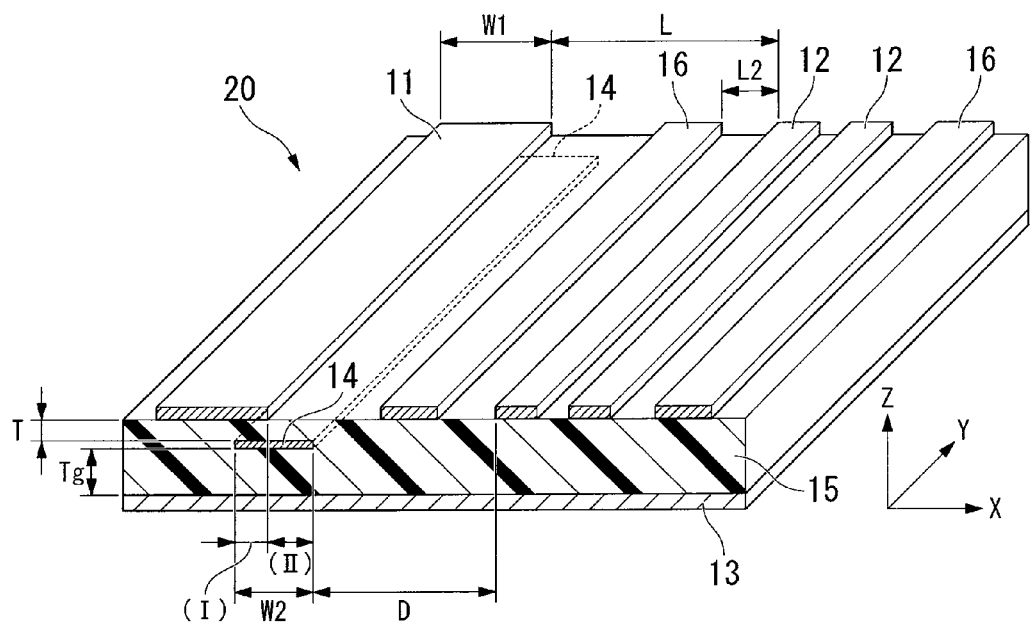
FIG. 2 is a perspective view illustrating the cross section of a transmission noise suppressing structure according to a second embodiment of the invention.

FIG. 2 is a perspective view illustrating the cross section of a transmission noise suppressing structure according to a second embodiment of the invention.

A transmission noise suppressing structure 20, which is a double-side board, includes: a power supply line 11 and two signal transmission lines 12 arranged apart from each other side by side in a Y direction on the front surface (the same surface) of the board; a surface ground layer 13 disposed apart from the power supply line and the signal transmission lines so as to face the power supply line 11 and the signal transmission lines 12 with an insulating layer 15 interposed therebetween and covering the entire rear surface of the board; a resistive layer 14 arranged in the Y direction apart from the power source line and the ground layer so as to face the power source line 11 and the ground layer 13 with the insulating layer 15 interposed therebetween; and two ground lines 16 disposed between the power supply line 11 and the signal transmission line 12 adjacent to each other and arranged in the Y direction apart from the power supply line and the signal transmission line side by side.

The resistive layer 14 has an area (I) which faces the power supply line 11 and an area (II) which does not face the power supply line 11. The resistive layer 14 is disposed apart from the signal transmission lines 12 in an X direction.

In the transmission noise suppressing structure 20, like the reason for supplying the transmission noise suppressing structure 10, a width W1 of the power supply line 11 in the X direction and a width W2 of each resistive layer 14 in the X direction satisfy Expression (1-2). That is, the width of the resistive layer 14 is narrower than the width of the power supply line 11.

$$W1 \geq W2 \tag{1-2}$$

In the transmission noise suppressing structure 20, it is considered that a high-frequency noise current (transmission noise) flowing in the power supply line 11 is suppressed by the same mechanism as that of the transmission noise suppressing structure 10.

In the transmission noise suppressing structure 20, it is preferable that a width D of the gap between the resistant layer 14 and the signal transmission line 12 close to the resistance layer 14 in the X direction and an inter-line distance L2 between the ground line 16 and the signal transmission line 12 in the X direction satisfy Expression (2).

$$D > L2 \tag{2}$$

When the distance D is equal to or smaller than the distance L2, the cross talk between the power supply line 11 and the signal transmission line 12 becomes strong and thus the high-frequency noise existing in the power supply line 11 is propagated to the signal transmission line 12.

For the same reason as the reason for providing the transmission noise suppressing structure 10, in the transmission noise suppressing structure 20, it is preferable that the width D of the gap between the resistant layer 14 and the signal transmission line 12 close to the resistance layer 14 in the X direction, the distance T between the power supply line 11 and the resistance layer 14 in the Z direction, the width W1 of the power supply line 11 in the X direction, and the distance L between the power supply line 11 and the signal transmission line 12 close to the power supply line 11 in the X direction also satisfy Expression (3).

$$3T \leq D < (L+W1) \tag{3}$$

The signal transmission line 12 has a coplanar structure and has a configuration with impedance to be decided. Therefore, when the resistive layer 14 is close to the signal transmission line 12 over the ground line 16, the impedance of the signal transmission line 12 may be changed. In order to minimize the influence of the change in the impedance, it is preferable that the width D is equal to or larger than the distance 3T.

For the same reason as the reason for providing the transmission noise suppressing structure 10, in the transmission noise suppressing structure 20, it is preferable that the distance T between the power supply line 11 and the resistant layer 14 in the Z direction, and the distance Tg between the ground layer 13 and the resistant layer 14 in the Z direction also satisfy Expression (4).

$$T < Tg \tag{4}$$

Third Embodiment

Figure 9:
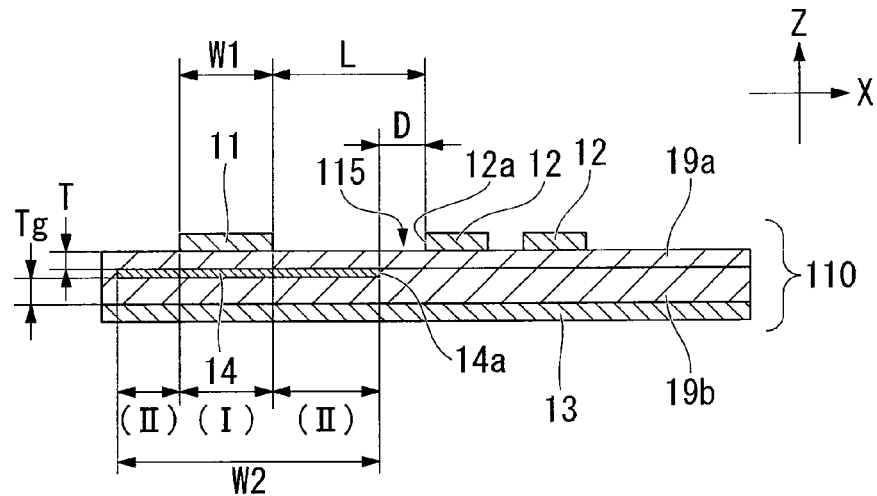
FIG. 9 is a sectional view illustrating a transmission noise suppressing structure according to a third embodiment of the invention.
Figure 10:
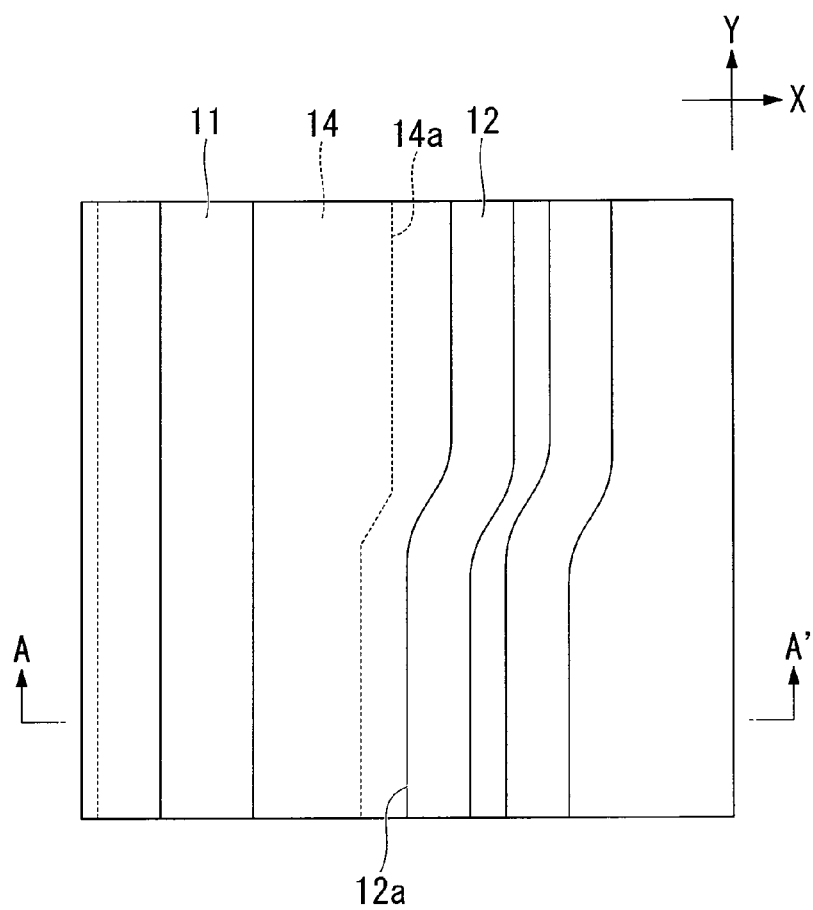
FIG. 10 is a top view illustrating the transmission noise suppressing structure according to the third embodiment of the invention.

FIGS. 9 and 10 are diagrams illustrating the transmission noise suppressing structure according to a third embodiment of the invention. FIG. 10 is a top view and FIG. 9 is a sectional view taken along the line A-A' of FIG. 10.

The transmission noise suppressing structure 110 according to this embodiment is a double-side board in which the power supply line 11 and the signal transmission lines 12 are disposed on the front surface and the ground layer 13 is disposed on the rear surface. The power supply line 11 and the signal transmission lines 12 are disposed on the same surface and arranged side by side apart from each other. The resistive layer 14 is disposed between the power supply line 11 and the ground layer 13.

The ground layer 13 is disposed apart from the power supply line and the signal transmission line so as to face the power supply line 11 and the signal transmission line 12, and the resistive layer 14 is disposed apart from the power supply line and the ground layer so as to face the power supply line 11 and the ground layer 13. Specifically, in this embodiment, the power supply line 11 and the resistive layer 14 are laminated so as to face each other with a first insulating layer 19a interposed therebetween, and the ground layer 13 and the resistive layer 14 are laminated so as to face each other with a second insulating layer 19b. In the invention, the term "facing" means a state where at least parts overlap with each other when viewed from the front surface. The power supply line 11 and the ground layers 13 are laminated so as to face each other with the first insulating layer 19a, the resistive layer 14, and the second insulating layer 19b interposed therebetween. The signal transmission line 12 and the ground layer 13 are laminated so as to face each other with the first insulating layer 19a and the second insulating layer 19b interposed therebetween.

In this embodiment, the width direction of the power supply line 11 is referred to as "an X direction", the length direction of the power supply line is referred to as "a Y direction", and the thickness direction of the power supply line is referred to as "a Z direction" (hereinafter, the same is applied). The width (which refers to a width W2 in the drawing) of the resistive layer 14 in the X direction is larger than the width (which refers to a width W1 in the drawing) of the power supply line 11. The resistive layer 14 and the signal transmission lines 12 are apart from each other in the X direction. A gap 115 is present in the X direction between an edge end 14a of the resistive layer 14 and an edge end 12a of the signal transmission line 12. The width of the gap 115 in the X direction is referred to as a distance D between the resistive layer 14 and the signal transmission line 12.

In the transmission noise suppressing structure 110, it is considered that a high-frequency noise current flowing in the power supply line 11 or the ground layer 13 is suppressed as follows.

That is, the resistive layers 14 are connected to the power supply line 11 in an electromagnetic coupling manner. Therefore, the eddy current is generated in the resistive layer 14 so that the magnetic flux density cancelling the change in the magnetic flux density (electric flux density) caused due to the high-frequency current flowing in the power supply line 11 occurs in a reverse direction. Thus, the eddy current suffers a loss by the resistance, and thus the high-frequency noise current of the power supply line 11 and the ground layer 13 is reduced. In order to effectively obtain the transmission noise suppressing effect, it is preferable that the magnitude distribution (a magnetic flux density or an electric flux density) of the electromagnetic field focused on the edge end of the power supply line 11 is directed toward the ground layer and focused on the resistive layer 14.

In this case, when the resistive layer 14 is present between the signal transmission line 12 and the ground layer 13, signals are also suppressed. Therefore, as shown in FIG. 9, it is necessary to avoid disposing the resistive layers 14 at the positions facing the signal transmission lines 12. The high-frequency current flows in the resistive layers 14, and thus an electromagnetic field is radiated from the resistance layer 14, particularly, from the edge end of the resistance layer. Therefore, when the signal transmission line 12 exists in the vicinity of the resistance layer 14, the high-frequency noise of the power supply line 11 may affect the signal transmission line 12 through the resistance layer 14. For this reason, it is necessary to separate the edge end 14a of the resistance layer 14 from the edge end 12a of the signal transmission line 12 and provide the gap 115.

It is preferable that the width D (the distance D between the resistive layer 14 and the signal transmission line 12 in the X direction) of the gap 115 is equal to or larger than a distance 3T, when it is assumed that a gap distance between the power supply line 11 and the resistive layer 14 in the thickness direction (Z direction) of the power supply line 11 is T. When the width D is smaller than the distance 3T, the noise in the power supply line 11 may easily be transmitted to the signal transmission line 12. The signal transmission line 12 has a microstrip structure and has impedance to be decided. Therefore, when the signal transmission line is close to the resistance layer 14, the impedance of the signal transmission line is changed. For this reason, in order to minimize the influence of the change in the impedance, it is preferable that the width D of the gap 115 is equal to or larger than the distance 3T. Moreover, when it is assumed that the inter-line distance between the power supply line 11 and the signal transmission line 12 in the X direction is L, the width D of the gap 115 is smaller than the sum (L+W1) of the inter-line distance L and the width W1 of the power supply line 11. That is, it is preferable to satisfy a relation of $3T \leq D < (L+W1)$.

When the width D is equal to or larger than the sum (L+W1), the power supply line 11 and the resistant layer 14 do not face each other. Then, since the change in the magnetic flux density (electric flux density) occurring in the edge end of the power supply line 11 cannot be captured in the resistant layer 14, the transmission noise suppressing effect obtained by providing the resistant layer 14 is completely lost. In terms of the transmission noise suppressing effect, it is preferable that the width D of the gap 115 is smaller than the inter-line distance L.

The gap distance T between the power supply line 11 and the resistive layer 14 is preferably in the range from 2 to 100 μm depending on the thickness of the board. When the gap distance T is smaller than 2 μm, it is difficult to maintain the insulating property. For example, when a power supply line having a different voltage is disposed close, an inappropriate leak may occur. When the gap distance T is larger than 100 μm, the transmission noise suppressing effect becomes weak in that the change in the magnetic flux density from the power supply line is weakened. The gap distance T is more preferably in the range from 5 to 50 μm.

When the resistive layer 14 is disposed between the power supply line 11 and the ground layer 13, like this embodiment, it is more effective in terms of the transmission noise suppressing effect that the gap distance T between the power supply line 11 and the resistive layer 14 is smaller than the distance Tg between the ground layer 13 and the restive layer 14 in the Z direction. That is, as for the insulating layer present between the power supply line 11 and the ground layer 13, it is more effective in terms of the transmission noise suppressing effect that the resistive layer 14 is disposed so that the resistive layer 14 is closer to the power supply line 11 than the ground layer 13.

The inter-line distance L between the power supply line 11 and the signal transmission line 12 is preferably in the range from 10 to 5000 μm, even though the inter-line distance depends on an individual pattern design. More preferably, a more preferable range than the inter-line distance L is from 100 to 1000 μm.

Fourth Embodiment

Figure 11:
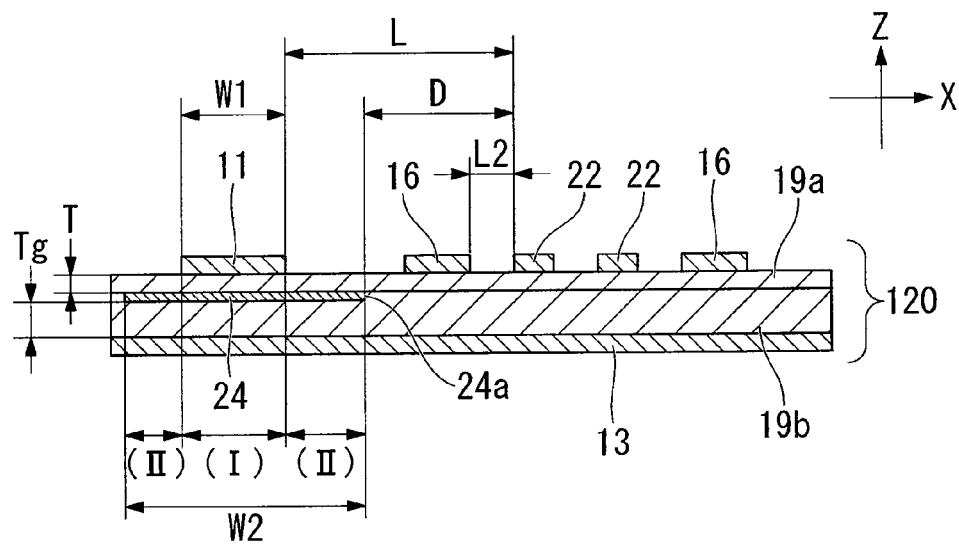
FIG. 11 is a sectional view illustrating a transmission noise suppressing structure according to a fourth embodiment of the invention.
Figure 12:
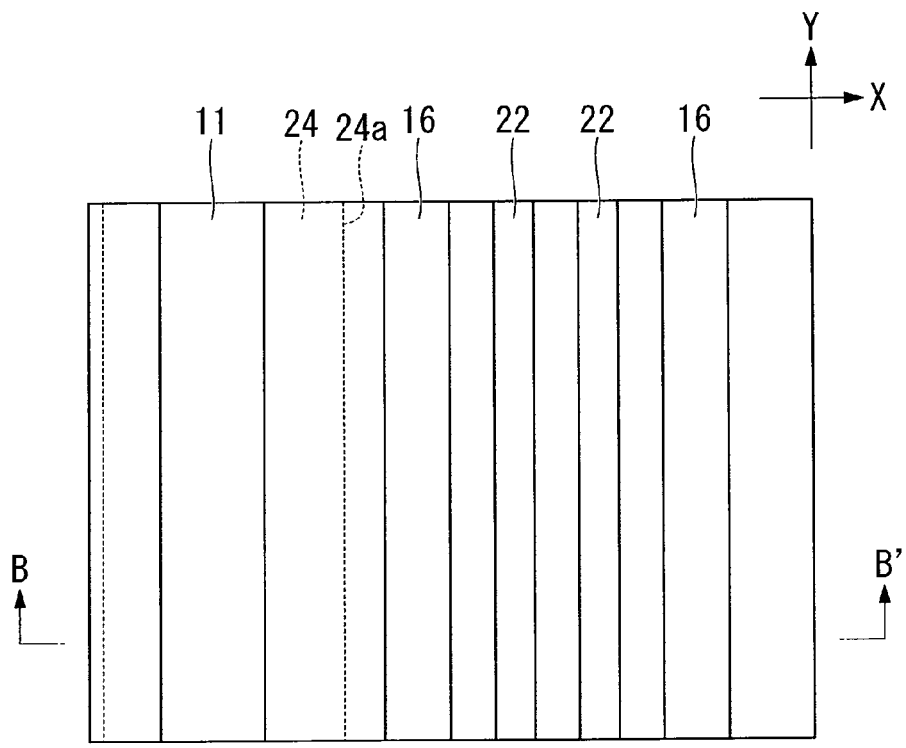
FIG. 12 is a top view illustrating the transmission noise suppressing structure according to the fourth embodiment of the invention.

FIGS. 11 and 12 are diagrams illustrating the transmission noise suppressing structure according to a fourth embodiment of the invention. FIG. 12 is a top view and FIG. 11 is a sectional view taken along the line B-B' of FIG. 12. Hereinafter, the same reference numerals are given to the same constituent elements and the description thereof is omitted.

Unlike the third embodiment, in the transmission noise suppressing structure 120 according to this embodiment, the ground line 16 is disposed on the same surface on which a power supply line 11 and signal transmission lines 22 are disposed and between the power supply line 11 and the signal transmission line 22 adjacent to each other. The power supply line 11, the signal transmission lines 22, and the ground line 16 are arranged apart from each other side by side.

The signal transmission line 12 according to the third embodiment does not have a straight shape, but has a curved portion when viewed from the front surface, as shown in FIG. 10. On the contrary, the signal transmission line 22 according to this embodiment has a straight shape, as shown in FIG. 12. In addition, one end 14a of the resistive layer 14 according to the third embodiment does not have a straight shape, when viewed from the front surface, as shown in FIG. 10, but has a curved portion following the shape of the curved portion of the signal transmission line 12. On the contrary, one end 24a of the resistive layer 24 according to this embodiment has a straight shape, as shown in FIG. 12.

The width W2 of the resistive layer 24 is broader than the width W1 of the power supply line 11. The resistive layer 24 and the signal transmission lines 22 are apart from each other in the X direction. The signal transmission line 22 has a coplanar structure and has a configuration with impedance to be decided. Therefore, when the resistive layer 24 is close to the signal transmission line 22 over the ground line 16, the impedance of the signal transmission line may also be changed. In order to minimize the influence of the change in the impedance, it is preferable that the distance D (the width D of the gap) between the resistive layer 24 and the signal transmission line 22 in the X direction is equal to or larger than the distance 3T.

On the assumption that the inter-line distance between the ground line 16 and the signal transmission line 22 in the X direction is L2, it is preferable that the width D of the gap between the resistive layer 24 and the signal transmission line 22 is larger than L2 (D>L2).

As in the third embodiment, on the assumption that the inter-line distance between the power supply line 11 and the signal transmission line 22 in the X direction is L, it is preferable that the width D of the gap is smaller than the sum (L+W1) of the inter-line distance L and the width W1 of the power supply line 11.

Fifth Embodiment

Figure 13:
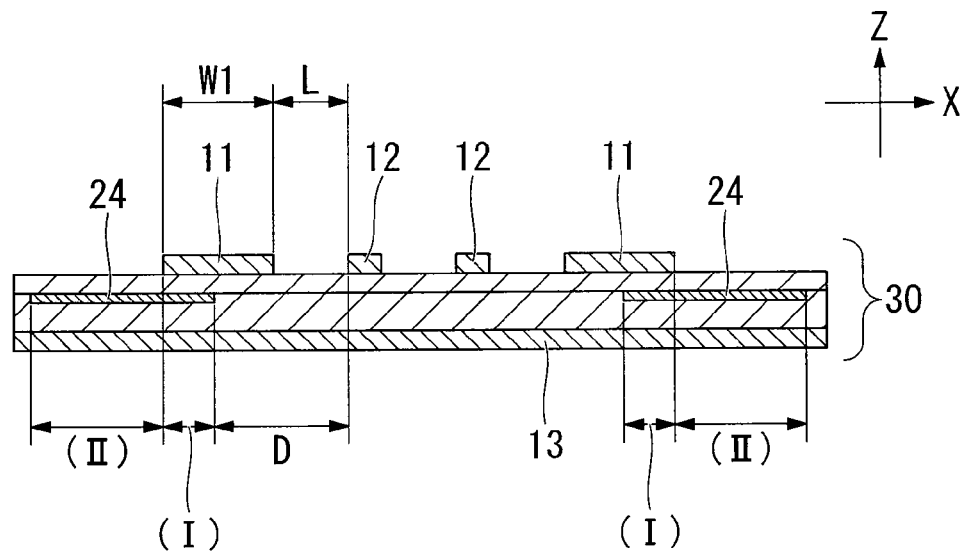
FIG. 13 is a sectional view illustrating a transmission noise suppressing structure according to a fifth embodiment of the invention.

FIG. 13 is a sectional view illustrating a transmission noise suppressing structure according to a fifth embodiment of the invention.

In the transmission noise suppressing structure 30 according to this embodiment, the power supply lines 11 are disposed outside two signal transmission lines 12 arranged side by side, respectively, and the resistive layers 24 are disposed outward below the power supply lines 11, respectively. That is, in this embodiment, the width D of the gap between the resistive layer 24 and the signal transmission line 12 is larger than the inter-line distance L between the power supply line 11 and the signal transmission line 12 and a part of each resistive layer 24 faces each power supply line 11. FIG. 13 shows the configuration of the gap (D)=(L+W1)/2.

Sixth Embodiment

Figure 14:
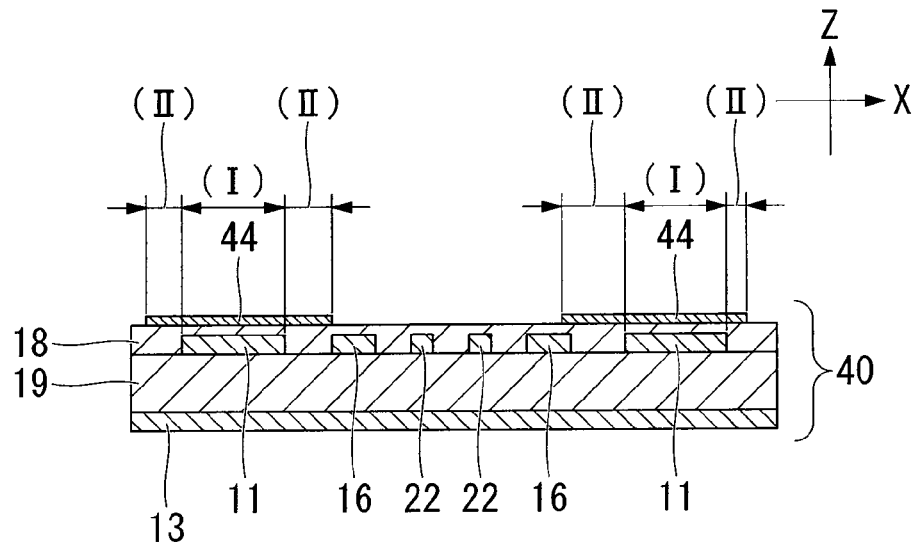
FIG. 14 is a sectional view illustrating a transmission noise suppressing structure according to a sixth embodiment of the invention.

FIG. 14 is a sectional view illustrating a transmission noise suppressing structure according to a sixth embodiment of the invention.

In a transmission noise suppressing structure 40 according to this embodiment, the power supply lines 11, the signal transmission lines 12, and the ground lines 16 are disposed on the same surface. A resistive layer 44 is laminated on the opposite side of the ground layer 13 with reference to the power supply line 11 so as to face the ground layer with a third insulating layer 18 interposed therebetween.

In this embodiment, the power supply lines 11, the ground lines 16, and the signal transmission lines 12 face the ground layer with a fourth insulating layer 19 interposed therebetween. Each resistive layer 44 and the ground layer 13 face each other with the third insulating layer 18, the power supply line 11, and the fourth insulating layer 19 interposed therebetween. A protective layer may be disposed on the resistive layer 44.

According to the first to sixth embodiments, the transmission noise suppressing structure includes the power supply line and the signal transmission line disposed apart from each other on the same surface, the ground layer disposed apart from the power supply line and the signal transmission line so as to face the power supply line and the signal transmission line, and the resistive layer disposed apart from the power supply line and the ground layer so as to face the power supply line and the ground layer. The resistive layer has the area (I) which faces the power supply line and the area (II) which does not face the power supply line. With such a configuration, it is possible to suppress the transmission noise transferred through the power supply line. Moreover, the transmission noise transferred through the ground layer is suppressed.

Since the transmission noise transferred through the power supply line is suppressed, the power supply voltage is thus stabilized. As a consequence, occurrence of the noise radiated from a power supply system is also suppressed.

Since the resistive layer and the signal transmission line are apart from each other in the X direction, it is possible to reduce the magnitude of a radiated electromagnetic field of the vicinity causing the cross talk of the signal transmission line without deterioration in the quality of a signal waveform.

That is, even when the signal transmission line and the power supply line are disposed on the same surface and the signal transmission line is present in the vicinity of the power supply line in order to increase the packaging density, it is possible to suppress the transmission noise transferred through the power supply line without connecting the resistive layer to the power supply line. Therefore, since the resistive layer can be disposed apart from the signal transmission line, it is possible to suppress the deterioration in the quality of the signal waveform caused by the cross talk of the signal transmission line occurring under the influence of the resistive layer.

According to the fifth embodiment, even when the distance L between the power supply line 11 and the signal transmission line 12 is small, it is possible to suppress the transmission noise while eliminating the influence of the resistive layer.

According to the sixth embodiment, even when the wiring circuit board is completed, it is possible to provide the resistive layer.

<Wiring Circuit Board>

Since the transmission noise suppressing structure according to the invention includes the power supply line, the signal transmission line, and the ground layer, the transmission noise suppressing structure can be used as the wiring circuit board.

By laminating a copper foil on the front surface and/or the rear surface of the transmission noise suppressing structure according to the invention with an insulating layer interposed therebetween, a circuit may be formed to configure a multi-layered wiring circuit board. In this case, when a via or the like for conducting a conductive member of the upper layer to a conductive member of the lower layer penetrates through the resistive layer, it is preferable that an insulation property is ensured by forming an anti-pad in the resistive layer.

(Conductive Layer)

The power supply line, the signal transmission line, the ground line, and the ground layer are each formed of a conductive layer. Examples of the conductive layer include a metal foil and a conductive particle dispersed film in which a polymer binder of metal particles, a hyaline binder, or the like is dispersed. Examples of the metal include copper, silver, gold, aluminum, nickel, and tungsten.

The conductive layer in the wiring circuit board (multilayered printed circuit board) is generally formed of a copper foil. The thickness of the copper foil is generally in the range from 3 to 35 µm. Since the copper foil improves adhesion of the insulating layer, the copper foil may be subjected to a roughening treatment or a chemical conversion treatment using a silane coupling agent or the like.

(Resistive Layer)

It is preferable that the resistive layer is a thin film formed with a thickness of 5 to 300 nm including a metal material or conductive ceramics by a physical vapor deposition. When the thickness of the resistive layer is smaller than 5 nm, it is easy to insufficiently form the resistive layer, and a transmission noise suppressing effect cannot be sufficiently obtained. When the thickness of the resistive layer is larger than 300 nm, the surface resistance is smaller and thus the metal reflection becomes strong. Therefore, the transmission noise suppressing effect is also reduced.

The thickness of the resistive layer is calculated by measuring and averaging the thicknesses of five positions on the basis of an image of the cross section taken along the Z direction by use of a high resolution transmission type electron microscope.

It is preferable that the surface resistance of the resistive layer is in the range from $1\times10^0$ to $1\times10^4 \Omega$. When the resistive layer is a homogeneous thin film, a restrictive material which has a high volume resistivity is necessary. However, when a material without a high volume resistivity is used, the surface resistance can be increased by forming a physical defect with no metal material or no conductive ceramics in the resistive layer to form a heterogeneous thin film or a film formed from a chain product of a micro cluster described below.

The surface resistance of the resistive layer is measured as follows.

A measuring target is put on two thin film metal electrodes (the length of which is 10 mm, the width of which is 5 mm, and the distance between the electrodes of which is 10 mm) formed by depositing gold or the like on quartz glass, and then tightly pressing a measuring target of 10 mm×20 mm with a load of 50 g to measure the resistance between the electrodes using a measurement current of 1 mA or less. This obtained value is set to the surface resistance.

Figure 3:
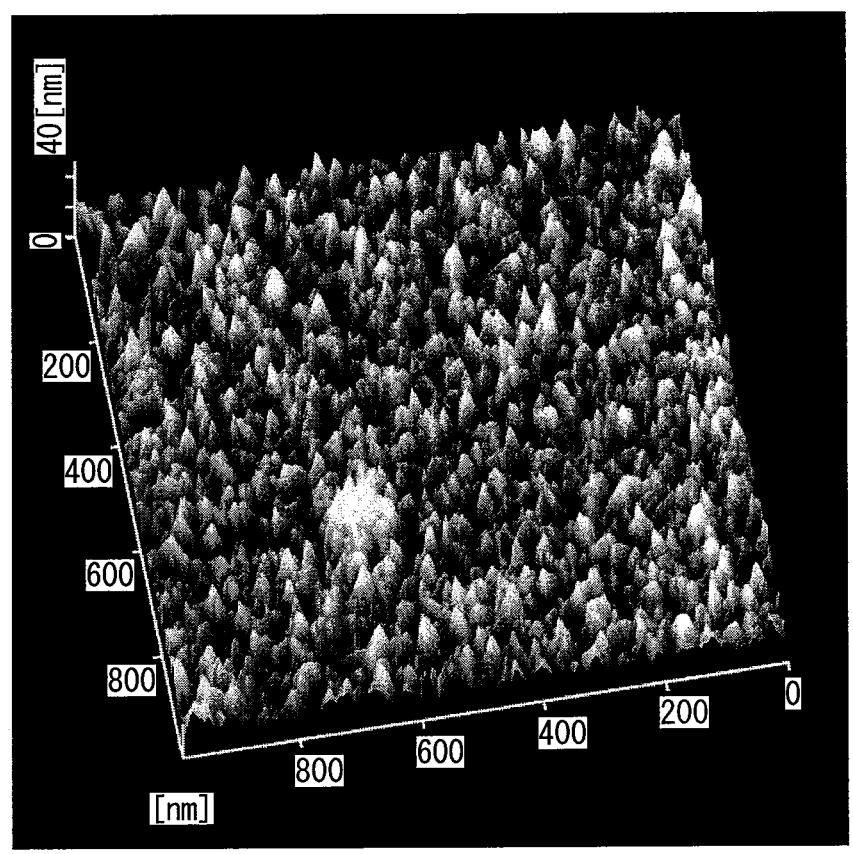
FIG. 3 is a diagram illustrating an image obtained by observing the surface of a resistive layer by use of an atomic force microscope.

FIG. 3 is a diagram illustrating an image obtained by observing the surface of the resistant layer of a thickness of 50 nm formed of a metal material formed on the surface of the insulating layer by a physical vapor deposition by use of an atomic force microscope. The resistive layer is observed as a collective of plural micro clusters. Since physical defects are present in the micro clusters, the micro clusters do not become a homogeneous thin film but have a structure with resistance. The micro clusters have an appropriate adhesive strength since an adhesive component such as epoxy resin penetrates through the defects.

Examples of a metal material used in the resistive layer include ferromagnetic metal and paramagnetic metal. Examples of ferromagnetic metal include iron, carbonyl iron, iron alloy such as Fe—Ni, Fe—Co, Fe—Cr, Fe—Si, Fe—Al, Fe—Cr—Si, Fe—Cr—Al, Fe—Al—Si, or Fe—Pt, cobalt, nickel, and alloys thereof. Examples of paramagnetic metal include gold, silver, copper, tin, lead, tungsten, silicon, aluminum, titanium, chrome, molybdenum, alloys thereof, and alloys with a ferromagnetic metal. Among these, nickel, iron chrome alloy, tungsten, or a noble metal is preferable in that they are resistive against oxidation. However, since noble metals are expensive, nickel, iron chrome alloy, or tungsten is preferable in practice, and nickel or nickel alloy is particularly preferable.

Examples of the conductive ceramics used for the resistive layer include alloy of metal and one or more elements selected from a group consisting of boron, carbon, nitrogen, silicon, phosphorus, and sulfur, an intermetallic compound, and a solid solution. Specifically, examples of the conductive ceramics include nickel nitride, titanium nitride, tantalum nitride, chromium nitride, zirconium nitride, titanium carbide, silicon carbide, chromium carbide, vanadium carbide, zirconium carbide, molybdenum carbide, tungsten carbide, chromium boride, molybdenum boride, chromium silicide, and zirconium silicide.

Since the conductive ceramics have a higher volume resistance than that of metal, the resistive layer containing the conductive ceramics is improved in precision for managing the surface resistance by the thickness, thereby achieving high chemical stability, high preservation stability, or the like. As the conductive ceramics, nitride or carbide is particularly preferable in that nitride or carbide is easily obtained by using a reactive gas such as a nitrogen gas or a methane gas in a physical vapor deposition.

Physical vapor deposition is used as a method of forming the resistive layer. In this method, the thickness is controlled by output and time in a simple way and with good precision even though the thickness is different depending on conditions or the material to be used. Therefore, by terminating the growth of a thin film in an initial step, a homogeneous thin film is not formed, but a heterogeneous thin film having minute physical defects can easily be formed.

The surface resistance in the heterogeneous thin film can also be adjusted also by a method of forming the defects by etching the homogeneous thin film with acid or the like and a method of forming the defects in the homogeneous thin film by laser ablation.

(Insulating Layer)

The insulating layer can be formed using a general organic or inorganic insulating material. For example, an organic material such as an epoxy resin, a BT resin, a fluorine resin, or a polyimide may be used and a material incorporated with a reinforcing material such as a glass net may be used as necessary. Alternatively, an inorganic material such as silicon, alumina, or glass may be used.

(Manufacturing Method)

The transmission noise suppressing structure according to the invention is manufactured by the following method, for example.

First, an epoxy-based varnish is applied to the copper foil, dried, and hardened to form a first insulating layer. A layer formed as the resistive layer is formed on the insulating layer by a physical vapor deposition method such as EB vapor deposition, radio-frequency ion plating, radio-frequency magnetron sputtering, DC magnetron sputtering, or facing target type magnetron sputtering, and then the resistive layer with a predetermined pattern is formed by laser ablation. Since the layer formed as the resistive layer is a thin film, unnecessary parts of the resistive layer can be removed easily and the resistive layer can be patterned.

Subsequently, a prepreg formed by impregnating epoxy resin or the like in a glass fiber and a copper foil are laminated in this order on the resistive layer, and then the prepreg is hardened to form a second insulating layer. In this way, it is possible to obtain a double-side board of which the front and rear surfaces are formed of the copper foil.

Subsequently, by etching the copper foils with a predetermined pattern shape by a photolithographic method, the power supply line, the signal transmission line, the ground line, and the like are formed and thus the transmission noise suppressing structure is obtained.

Subsequently, a copper foil is attached to one or both sides of the transmission noise suppressing structure with a prepreg interposed therebetween, as necessary, and then patterned by a known method to manufacture a multi-layered circuit board.

The transmission noise suppressing structure according to the sixth embodiment is manufactured by the following method, for example.

First, a double-side board in which copper foils are formed on the front and rear surface of the insulating layer is prepared. The copper foil on one surface thereof is etched with a predetermined pattern shape by photolithography to form the power supply lines 11, the signal transmission lines 22, and the ground lines 16. An epoxy-based varnish is applied to the power supply lines, the signal transmission lines, and the ground lines, dried, and hardened to form the insulating layer (the third insulating layer 18).

Subsequently, a mask is closely attached to the insulating layer, a layer formed as the resistive layer is formed on the entire surface of the insulating layer by a physical vapor deposition, and then the mask is removed to obtain the resistive layer with a predetermined shape.

After the layer formed as the resistive layer is formed on the entire surface of the insulating layer by the physical vapor deposition, the resistive layer may also be formed by patterning the layer by laser etching executed by chemical etching or drying.

EXAMPLES

Thickness of Resistive Layer

The cross section of the resistive layer was observed using the transmission type electron microscope (made by Hitachi Ltd. H9000NAR), and the thicknesses of five positions of the noise suppressing layer were measured and averaged.
(Surface Resistance)

A measuring target is put on two thin film metal electrodes (the length of which is 10 mm, the width of which is 5 mm, and the distance between the electrodes of which is 10 mm) formed by depositing gold or the like on quartz glass, and then tightly pressing the measuring target of 10 mm×20 mm with a load of 50 g to measure the resistance between the electrodes using a measurement current of 1 mA or less. This obtained value is set to the surface resistance.
(Transmission Noise Suppressing Effect and Cross Talk)

Figure 4:
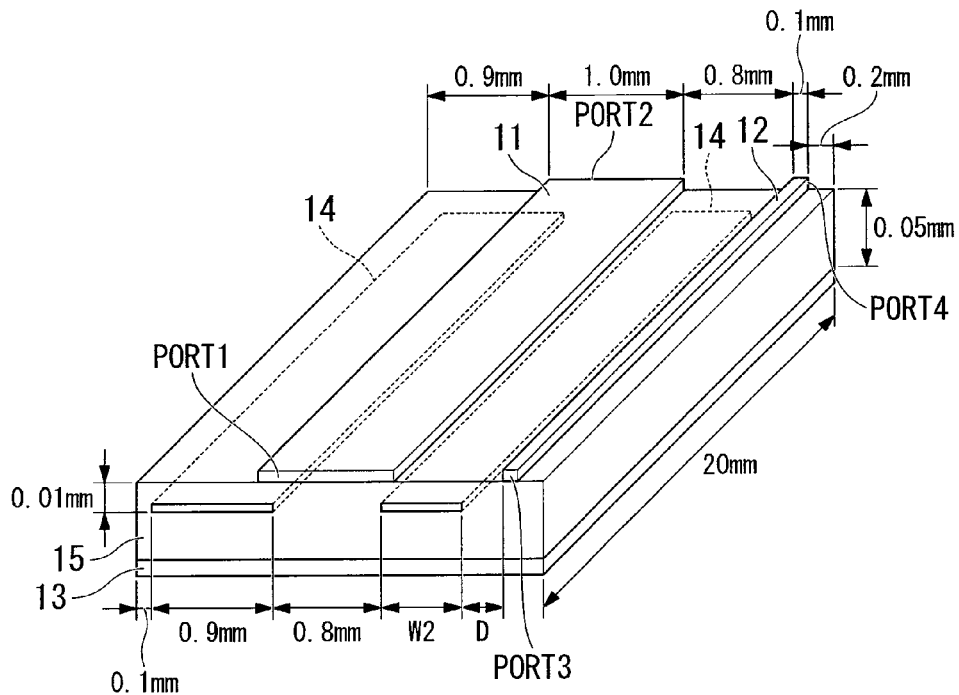
FIG. 4 is a perspective view illustrating the transmission noise suppressing structure according to Example 1 of the invention.
Figure 5:
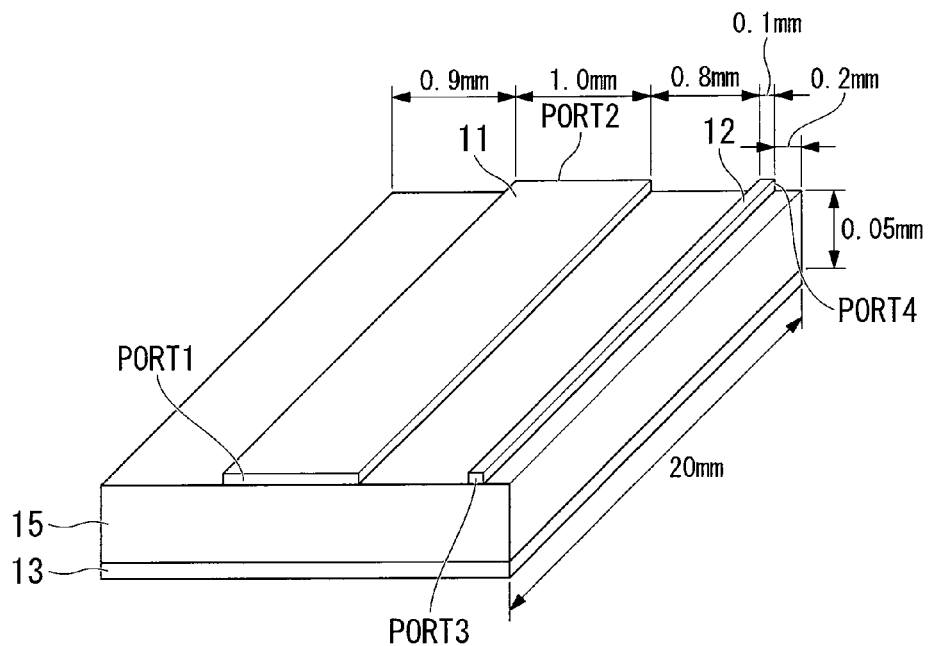
FIG. 5 is a perspective view illustrating a double-side board according to Comparative Example 1.

As a method of confirming the transmission noise suppressing effect, an S21 parameter between Port 1 and Port 2 shown in FIG. 4 or 5 was evaluated.

As a method of confirming the influence of the resistive layer on the signal transmission line, an S31 parameter (of near-end cross talk) between Port 1 and Port 3 shown in FIG. 4 or 5 and an S41 parameter (of far-end cross talk) between Port 1 and Port 4 shown in FIG. 4 or 5 were evaluated.

Since it is difficult to carry out actual measurement in a high frequency band of 1 GHz or more, the evaluation was carried out by a method using the 3D field simulator (made by Agilent Ltd., a product name: EMDS). A conductivity of 80000 S/m was used.

Example 1

As shown in FIG. 4, the transmission noise suppressing structure (microstrip structure) including the power supply line, the signal transmission line, the ground layer, and the resistive layer was manufactured.

First, two polyimide films in which a copper foil (with a thickness of 18 μm) is formed on one surface thereof are prepared. A thin film is formed by depositing nickel metal on the surface formed of polyimide of one film while permitting a nitrogen gas to flow by reactive sputtering. By etching the thin film, two resistive layers 14 (with a thickness of 25 nm) are formed. The surface resistance of the resistive layer 14 was 100Ω.

Subsequently, the surface formed of polyimide of the other film was superimposed and attached onto the surface, on which the resistive layers 14 are formed, with a polyimide-based adhesive interposed therebetween.

Subsequently, one copper foil is etched with the pattern shape shown in FIG. 4 by a photolithographic method, and thus the power supply line 11 and the signal transmission line 12 are formed to obtain the transmission noise suppressing structure.

The dimension of the obtained transmission noise suppressing structure is shown in FIG. 4.

Five kinds of transmission noise suppressing structures were manufactured by varying the width W2 of the resistive layer 14 to vary the width D of the gap by 0 mm, 0.1 mm, 0.2 mm, 0.3 mm, and 0.4 mm in a way of shifting the edge end, which is close to the signal transmission line 12, of the resistive layer 14 close to the signal transmission line 12.

Figure 6:
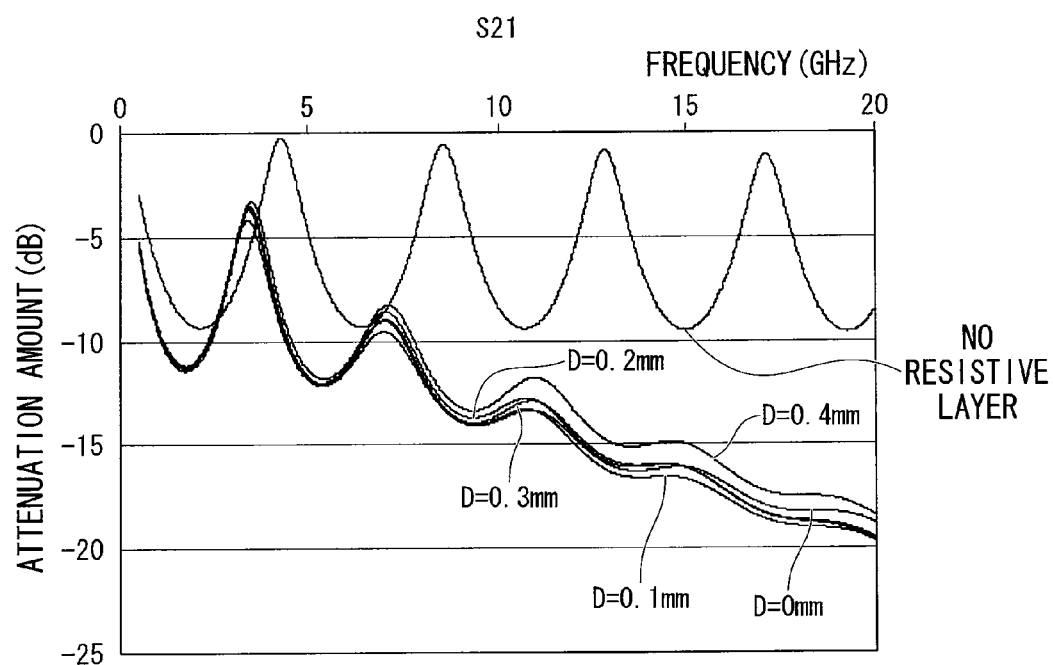
FIG. 6 is a graph illustrating a transmission noise suppressing effect (S21) according to Example 1 and Comparative Example 1.
Figure 7:
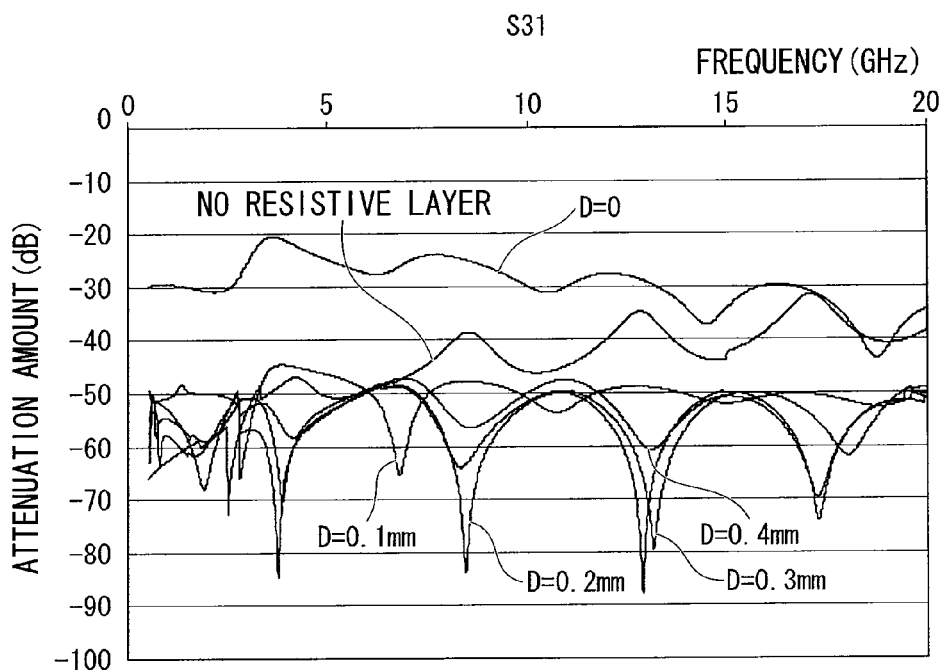
FIG. 7 is a graph illustrating near-end cross talk (S31) according to Example 1 and Comparative Example 1.
Figure 8:
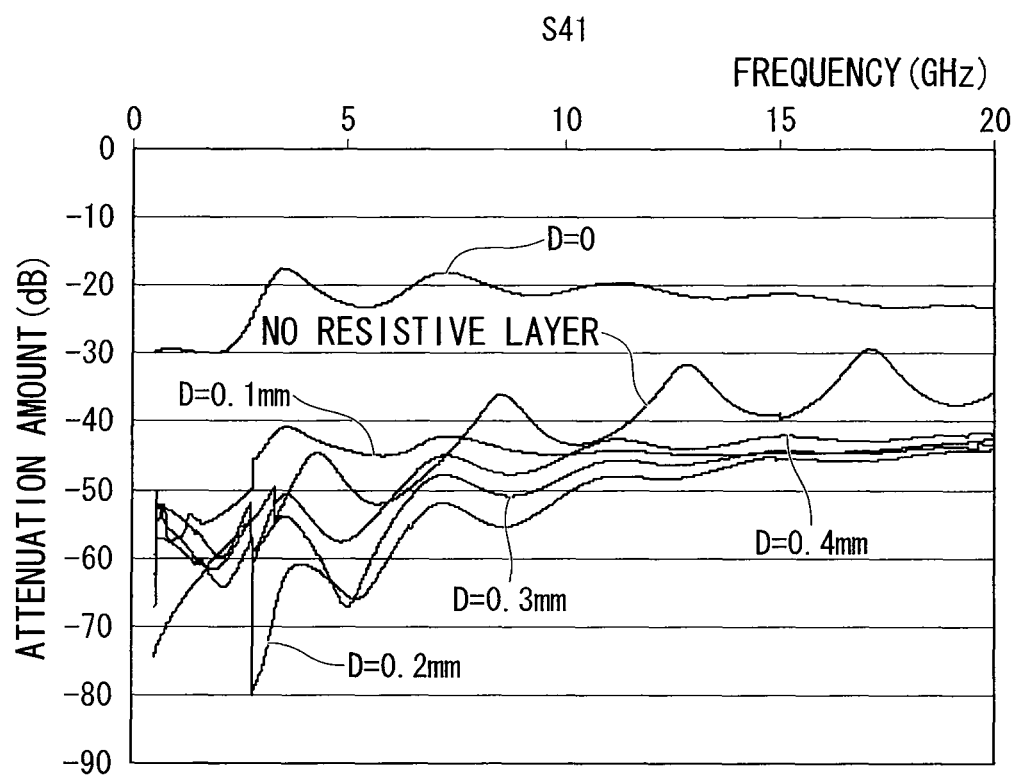
FIG. 8 is a graph illustrating far-end cross talk (S41) according to Example 1 and Comparative Example 1.

The S21 parameter, the S31 parameter, and the S41 parameter of each transmission noise suppressing structure were evaluated. The S21 parameter is shown in FIG. 6, the S31 parameter is shown in FIG. 7, and the S41 parameter is shown in FIG. 8. In FIGS. 7 and 8, since there is a resonance peak in the length direction of the board (the transmission noise suppressing structure), the total sum (quasi-integrated value) of attenuation amounts (dB) in respective frequencies was calculated to compare the total energy up to 20 GHz. The results are shown in Tables 1 and 2.

Comparative Example 1

Except that the resistive layer 14 is not provided, the configuration is the same as that of Example 1. The double-side board having the configuration shown in FIG. 5 was manufactured to carry out evaluation as in Example 1. The result is shown in FIGS. 6 to 8 and Tables 1 and 2.

TABLE 1

| NEAR-END CROSS TALK | NO RESISTIVE LAYER | D (mm) | | | | |
|---|---|---|---|---|---|---|
| | | 0 | 0.1 | 0.2 | 0.3 | 0.4 |
| TOTAL SUM OF S31 | −44768 | −29606 | −50516 | −56241 | −55051 | −53964 |
| DIFFERENCE | — | 15162 | −5748 | −11473 | −10283 | −9136 |

TABLE 2

| FAR-END CROSS TALK | NO RESISTIVE LAYER | D (mm) | | | | |
|---|---|---|---|---|---|---|
| | | 0 | 0.1 | 0.2 | 0.3 | 0.4 |
| TOTAL SUM OF S41 | −43115 | −22150 | −45209 | −52642 | −50037 | −47236 |
| DIFFERENCE | — | 20965 | −2094 | −9527 | −6922 | −4121 |

As for the transmission noise suppressing effect (S21), compared to the results of Example 1 and Comparative Example 1, in the case where the resistive layer is disposed, the transmission noise suppressing effect becomes larger as the width D of the gap is smaller, that is, the width of the resistive layer is broader. As for the frequency feature, the transmission noise suppressing effect becomes larger as the frequency is higher.

The near-end cross talk (S31) and the far-end cross talk (S41) show the same results. When the width D of the gap is 0 mm, the resistive layer and the signal transmission line cause the cross talk, compared to Comparative Example 1 where the resistive layer is not provided. When the width D of the gap is 0.1 mm or more, the influence of the cross talk is present, but further suppressed, compared to the case where this width is 0 mm.

Example 2

Figure 15:
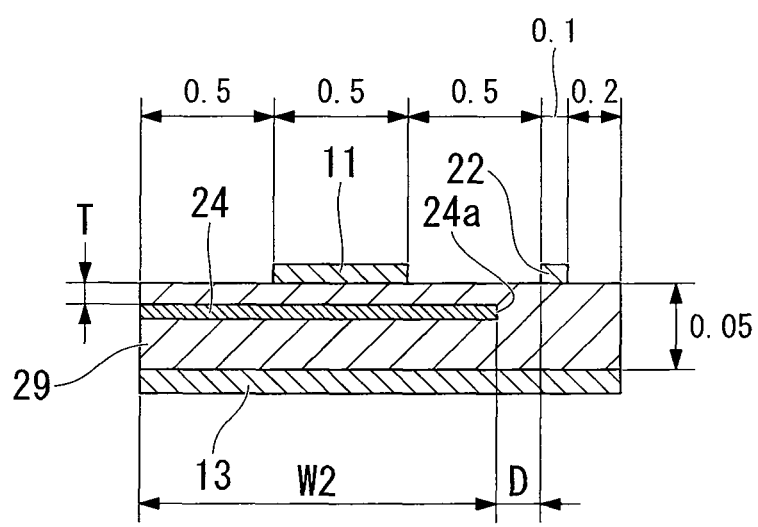
FIG. 15 is a sectional view illustrating a transmission noise suppressing structure according to Example 2.
Figure 16:
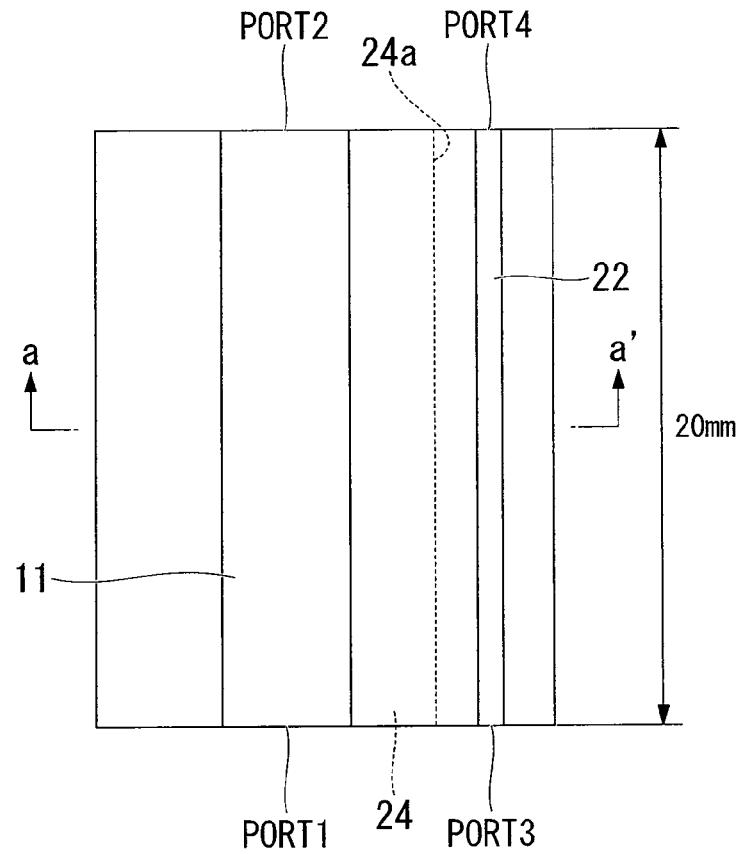
FIG. 16 is a top view illustrating the transmission noise suppressing structure according to Example 2.

The transmission noise suppressing structure (with the microstrip structure) including the power supply line, the signal transmission line, and the ground layer shown in FIGS. 15 and 16 was manufactured. FIG. 16 is a top view and FIG. 15 is a sectional view taken along the line a-a' of FIG. 16. In the drawings, reference numeral 29 denotes the insulating layer.

First, two polyimide films in which a copper foil (with a thickness of 18 μm) is formed on one surface thereof are prepared, and then the resistive layer 24 (with a thickness of 25 nm) is formed on the surface formed of polyimide of one film. The resistive layer 24 is formed by forming and etching a layer formed as the resistive layer on the entire surface by a physical vapor deposition.

Subsequently, the surface formed of polyimide of the other film was superimposed and attached onto the surface, on which the resistive layers 24 are formed, with a polyimide-based adhesive interposed therebetween.

Subsequently, the copper foil was etched with a predetermined pattern shape by a photolithographic method, and thus the power supply line 11 and the signal transmission line 22 were formed to obtain the transmission noise suppressing structure.

The dimension of the obtained transmission noise suppressing structure is shown in FIG. 15. The unit is mm (hereinafter, the same is applied). A gap distance T between the power supply line 11 and the resistive layer 24 was set to 0.01 mm.

Four kinds of transmission noise suppressing structures were manufactured by varying the width (W2) of the resistive layer 24 to vary the width D of the gap by 0, 0.1 mm, 0.25 mm, and 0.5 mm in a way of shifting the position of the end circumference of the resistive layer 24 close to the signal transmission line 22.

As the method of confirming the transmission noise suppressing effect, the S21 parameter between Port 1 and Port 2 shown in FIG. 16 was evaluated. As the method of confirming the influence of the resistive layer on the signal transmission line, the S31 parameter (of the near-end cross talk) between Port 1 and Port 3 and the S41 parameter (of the far-end cross talk) between Port 1 and Port 4 were evaluated.

Since it is difficult to make actual measurement in a high frequency band of 1 GHz or more, the evaluation was carried out by a method using the 3D field simulator (made by ANSOFT Ltd., product name: HFSS). The conductivity of 160,000 S/m was used.

Comparative Example 2

Figure 17:
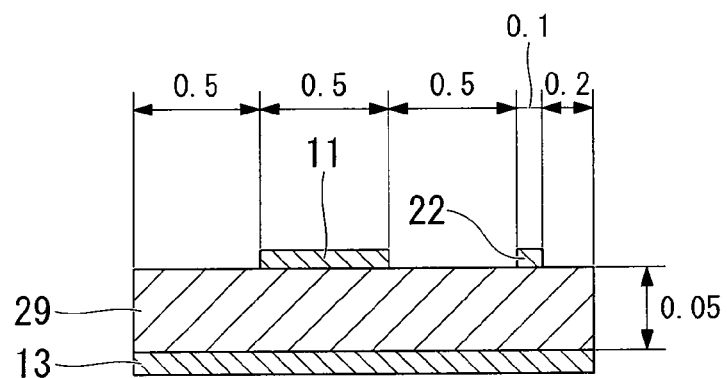
FIG. 17 is a sectional view illustrating a double-side board according to Comparative Example 2.

Except that the resistive layer 24 is not provided, the configuration is the same as that of Example 2. The double-side board having the configuration shown in FIG. 17 was manufactured to carry out evaluation as in Example 2.

Figure 18:
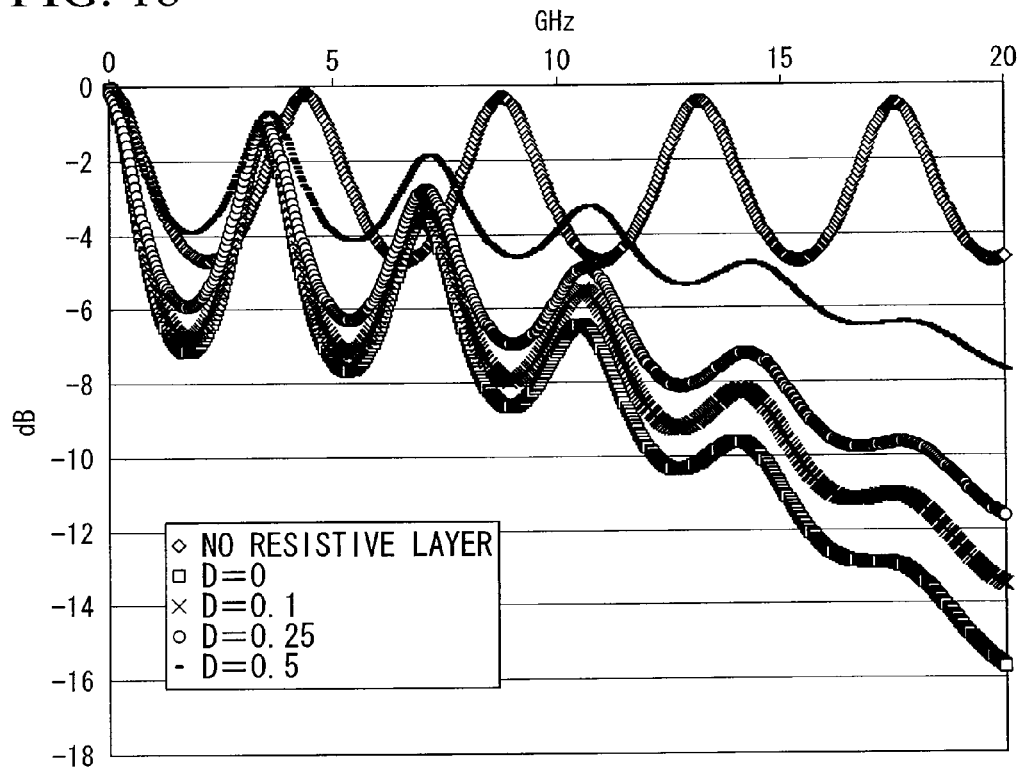
FIG. 18 is a graph illustrating a transmission noise suppressing effect (S21) according to Example 2 and Comparative Example 2.
Figure 19:
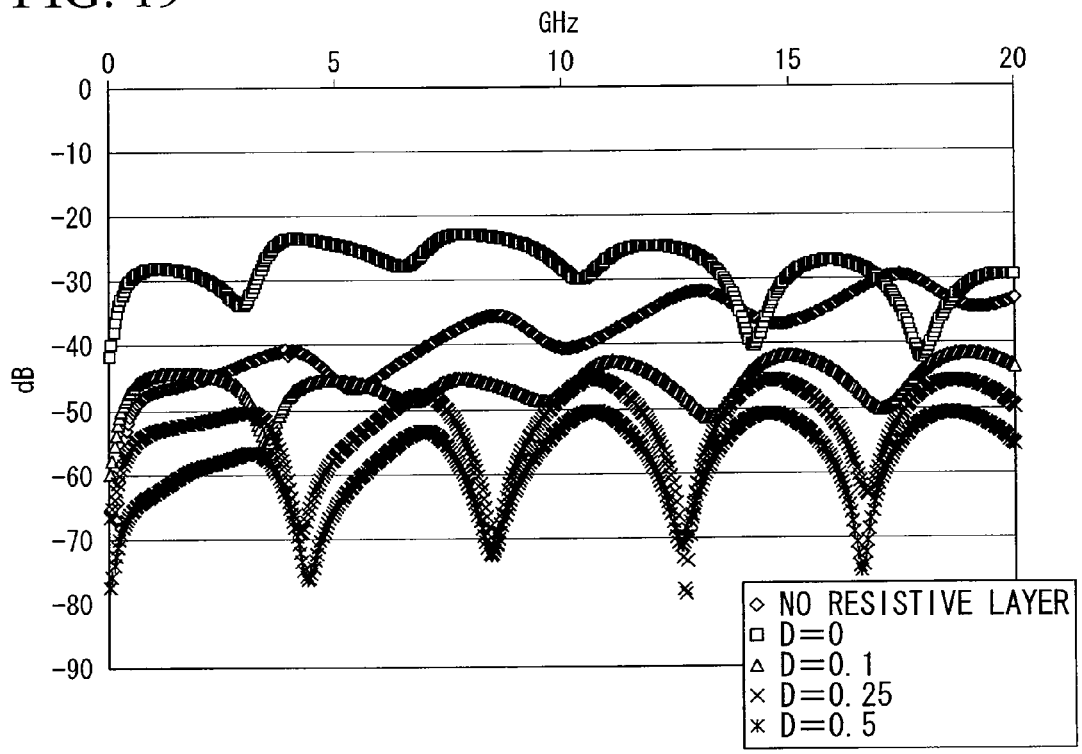
FIG. 19 is a graph illustrating near-end cross talk (S31) according to Example 2 and Comparative Example 2.
Figure 20:
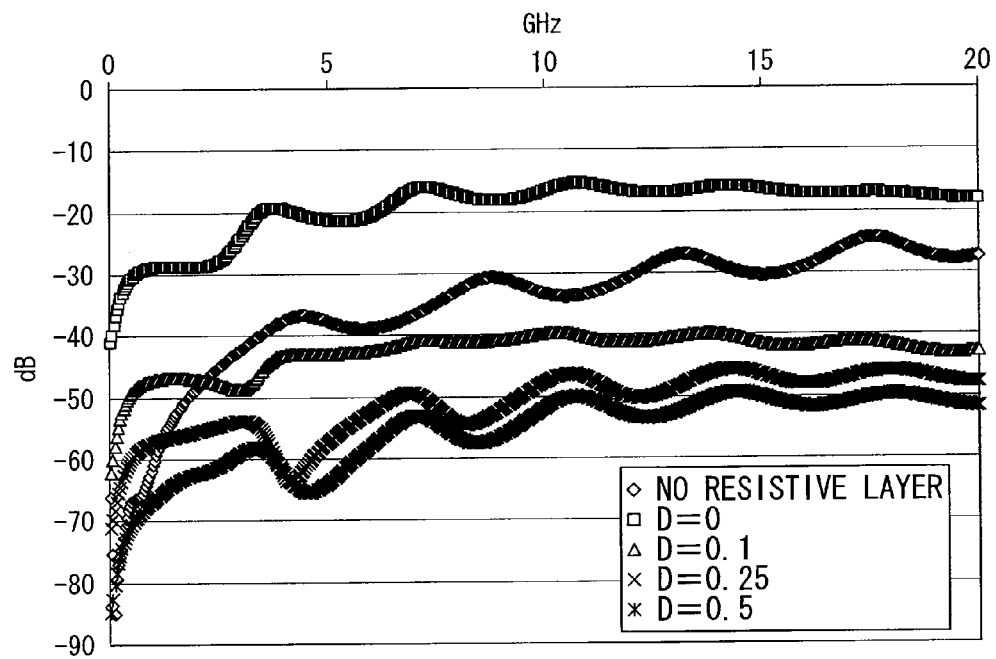
FIG. 20 is a graph illustrating far-end cross talk (S41) according to Example 2 and Comparative Example 2.

As the analyzed results of Example 2 and Comparative Example 2 (where the resistive layer is not provided), the transmission noise suppressing effect (S21) is shown in FIG. 18, the near-end cross talk (S31) is shown in FIG. 19, and the far-end cross talk (S41) is shown in FIG. 20. In FIGS. 19 and 20, since there is a resonance peak in the length direction of the board (the transmission noise suppressing structure), the total sum (quasi-integrated value) of attenuation amounts (dB) in respective frequencies was calculated to compare the total energy up to 20 GHz. The results are shown in Tables 3 and 4.

TABLE 3

| NEAR-END CROSS TALK | NO RESISTIVE LAYER | D = 0 | D = 0.1 | D = 0.25 | D = 0.5 |
|---|---|---|---|---|---|
| TOTAL SUM OF S31 | −19279 | −14252 | −22950 | −26390 | −29253 |
| DIFFERENCE | 0 | 5027 | −3671 | −7111 | −9974 |

TABLE 4

| FAR-END CROSSTALK | NO RESISTIVE LAYER | D = 0 | D = 0.1 | D = 0.25 | D = 0.5 |
|---|---|---|---|---|---|
| TOTAL SUM OF S41 | −17642 | −9759 | −21319 | −25576 | −27816 |
| DIFFERENCE | 0 | 7883 | −3677 | −7934 | −10174 |

(Evaluation)

As for the transmission noise suppressing effect (S21), compared to the results of Example 2 and Comparative Example 2, the transmission noise suppressing effect becomes larger as the width D is smaller, that is, the width of the resistive layer is broader in the case where the resistive layer is disposed. As for the frequency feature, the transmission noise suppressing effect becomes larger as the frequency is higher.

The near-end cross talk (S31) and the far-end cross talk (S41) show the same results. When the width (D) is 0 mm, the resistive layer and the signal transmission line cause the cross talk, compared to Comparative Example 2 where the resistive layer is not provided. When the width (D) of the gap is 0.1 mm or more, the cross talk is further suppressed, compared to Comparative Example 2 where the resistive layer is not provided.

Example 3

Figure 21:
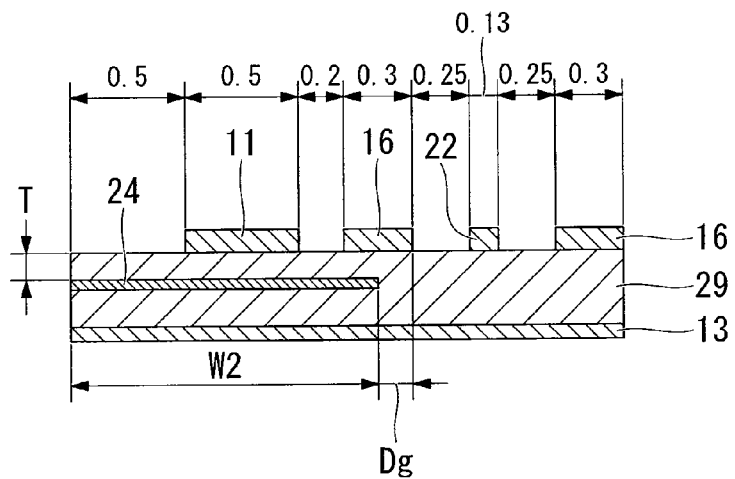
FIG. 21 is a sectional view illustrating a transmission noise suppressing structure according to Example 3.
Figure 22:
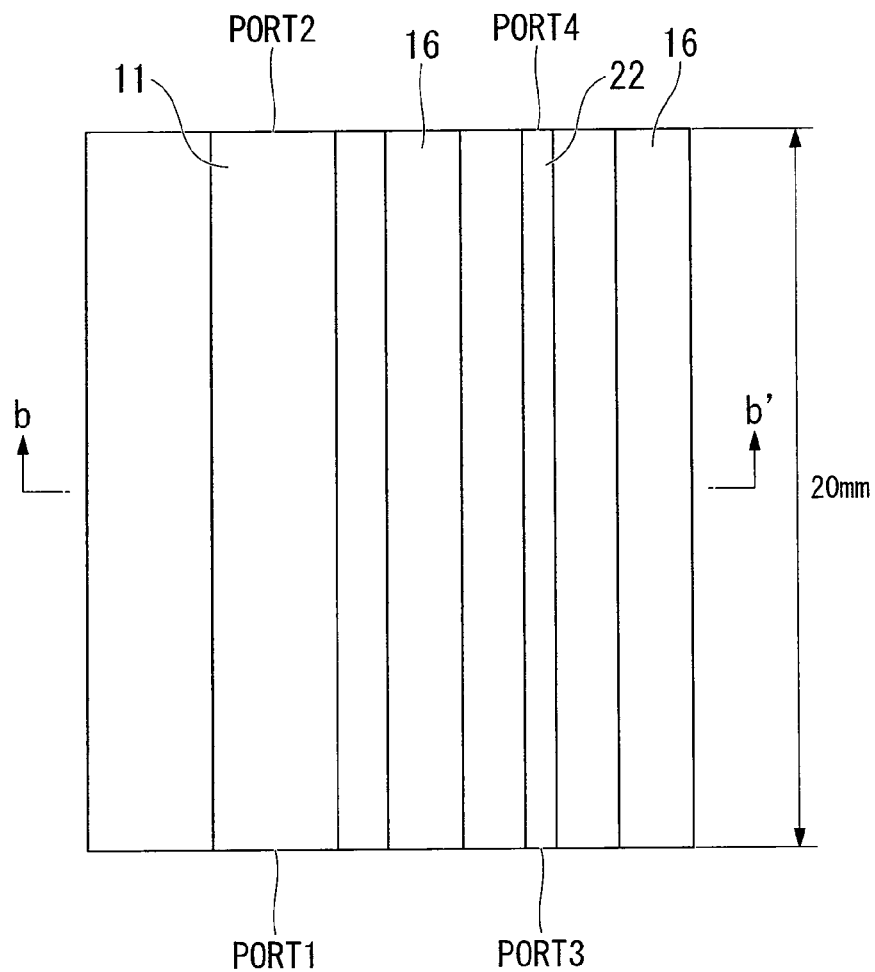
FIG. 22 is a top view illustrating a transmission noise suppressing structure according to Example 3.

The transmission noise suppressing structure (with the coplanar structure) including the power supply line, the signal transmission line, the ground lines, and the ground layer shown in FIGS. 21 and 22 was manufactured. FIG. 22 is a top view and FIG. 21 is a sectional view taken along the line b-b' of FIG. 22.

First, two base materials was prepared in which the copper foil (with a thickness of 18 μm) was disposed on one surface of the insulating layer formed when the prepreg formed by impregnating the epoxy resin in the glass fiber was hardened. The resistive layer 24 (with a thickness of 15 nm) was formed on the insulating layer of one base material. The resistive layer 24 is formed by etching after forming a layer formed as the resistive layer on the entire surface by a physical vapor deposition.

Subsequently, the insulating layer of one base material was superimposed and attached onto the surface, on which the resistive layers 24 are formed, with an epoxy-based adhesive interposed therebetween.

Subsequently, the copper foil was etched with a predetermined pattern shape by a photolithographic method, and thus the power supply line 11, the ground lines 16, and the signal transmission line 22 were formed to obtain the transmission noise suppressing structure. The gap distance T between the power supply line 11 and the resistive layer 24 was set to 0.02 mm.

Three kinds of transmission noise suppressing structures were manufactured by varying the width (W2) of the resistive layer 24 to vary a distance Dg between the end circumference of the ground line 16 close to the signal transmission line 22 and the end circumference of the resistive layer 24 in the X direction by 0, 0.25 mm, and 0.5 mm in a way of shifting the position of the end circumference of the resistive layer 24 close to the signal transmission line 22. In this case, the width D of the gap between the resistive layer 24 and the signal transmission line 22 is 0.25+Dg. The evaluation was carried out by a method using the 3D field simulator. The conductivity of the resistive layer was 80,000 S/m.

Comparative Example 3

Figure 23:
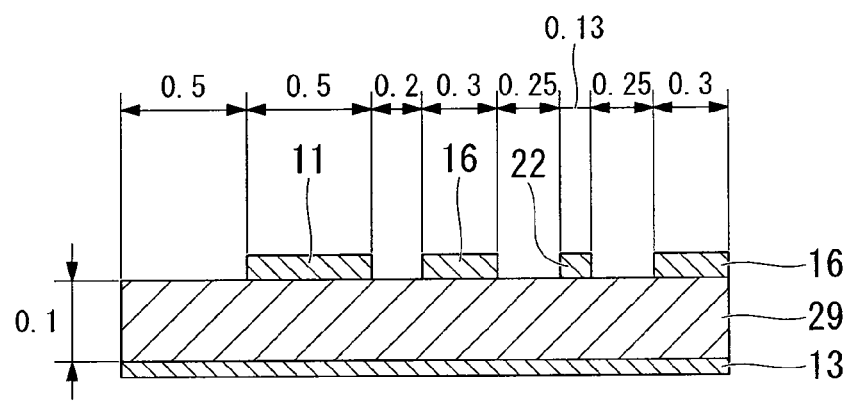
FIG. 23 is a sectional view illustrating a double-side board according to Comparative Example 3.

Except that the resistive layer 24 is not provided, the configuration is the same as that of Example 3. The double-side board having the configuration shown in FIG. 23 was manufactured.

The transmission noise suppressing structure obtained in Example 3 and the double-side board (with no resistive layer) obtained in Comparative Example 3 were evaluated in the same way as that of Example 2.

Figure 24:
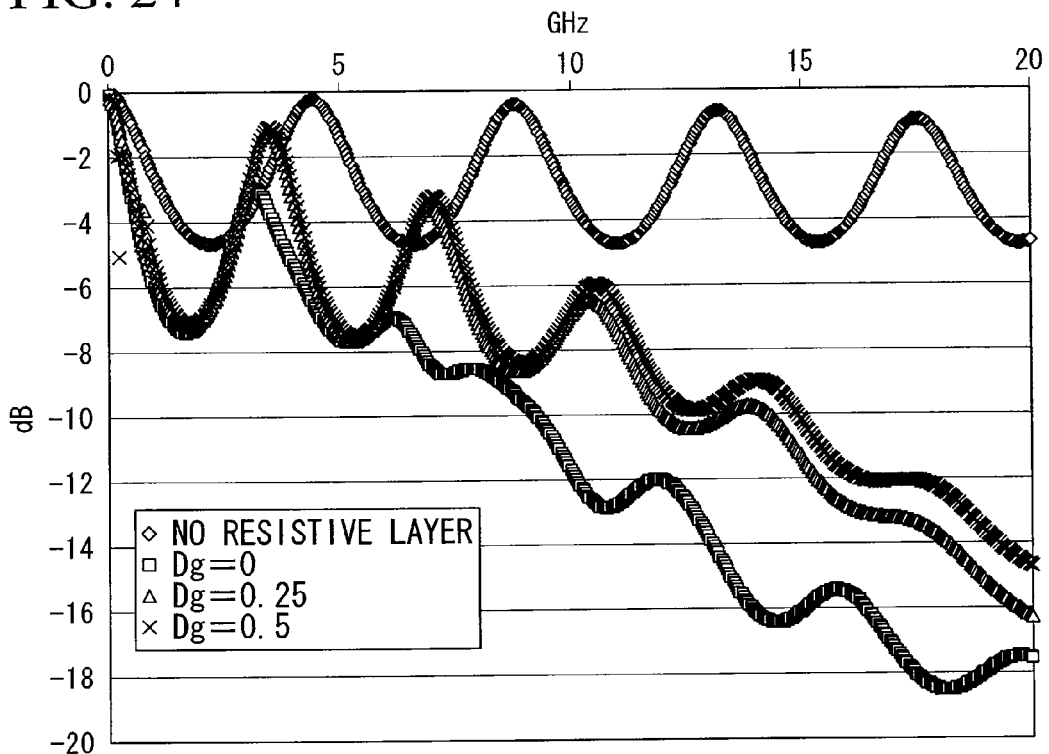
FIG. 24 is a graph illustrating a transmission noise suppressing effect (S21) according to Example 3 and Comparative Example 3.
Figure 25:
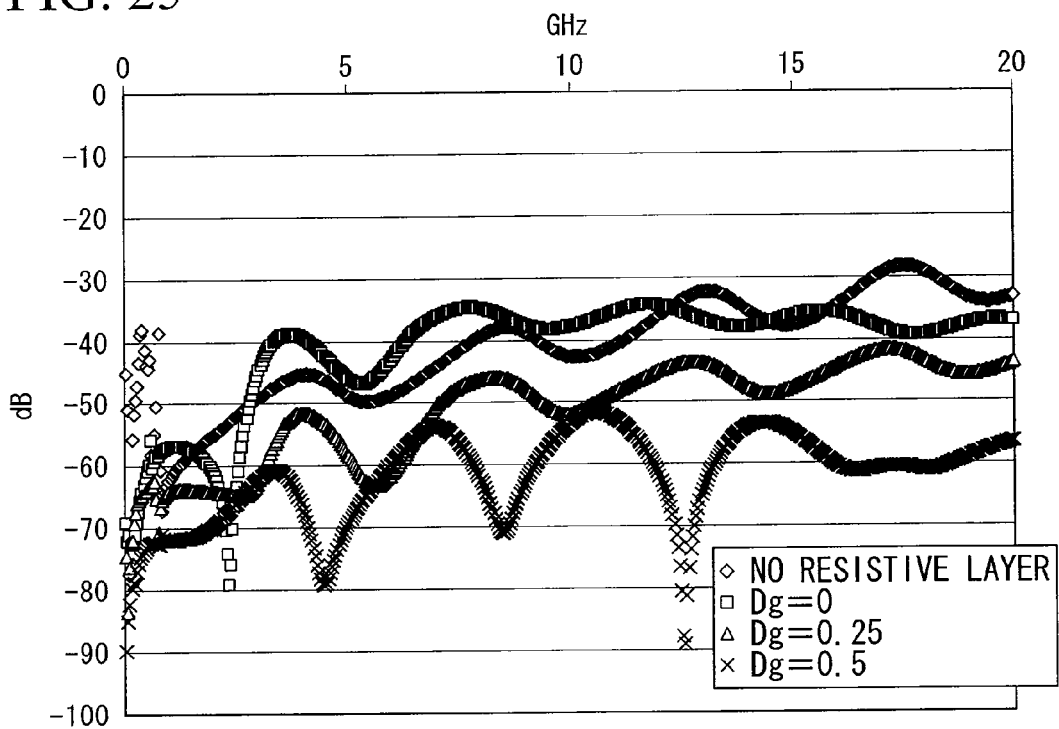
FIG. 25 is a graph illustrating near-end cross talk (S31) according to Example 3 and Comparative Example 3.
Figure 26:
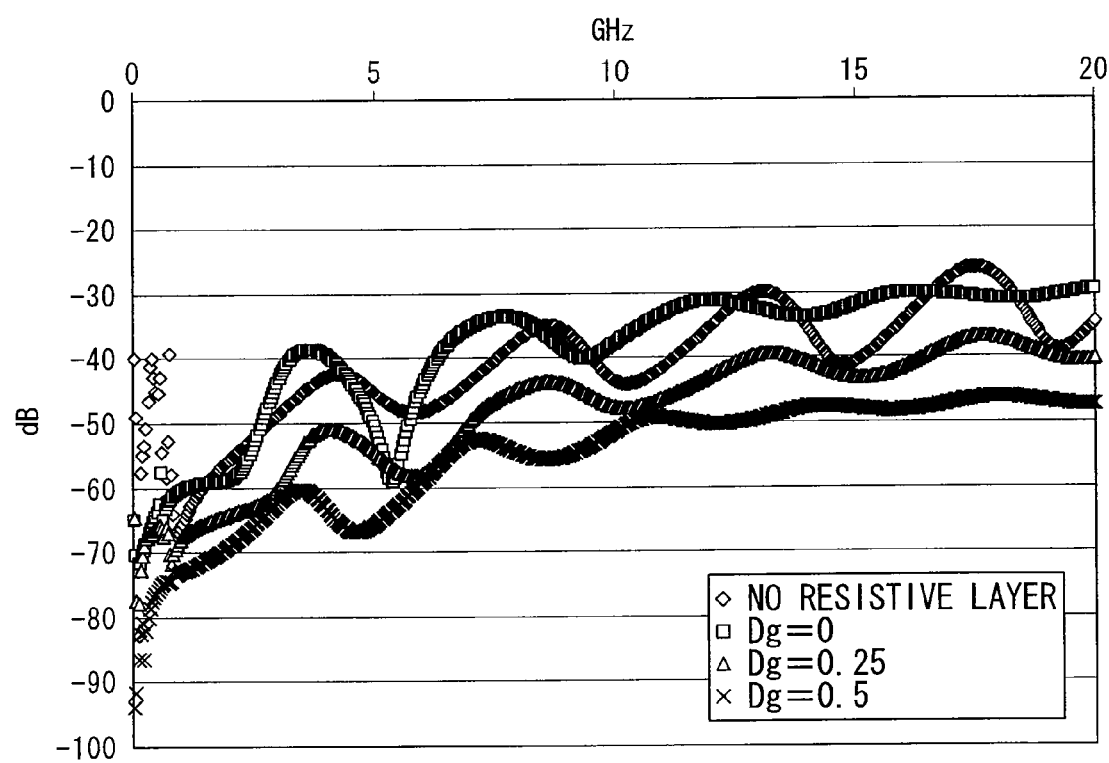
FIG. 26 is a graph illustrating far-end cross talk (S41) according to Example 3 and Comparative Example 3.

As the analyzed results, the transmission noise suppressing effect (S21) is shown in FIG. 24, the near-end cross talk (S31) is shown in FIG. 25, and the far-end cross talk (S41) is shown in FIG. 26. As in Example 2, the total sum (quasi-integrated value) of attenuation amounts (dB) in respective frequencies was calculated. The results are shown in Tables 5 and 6.

TABLE 5

| NEAR-END CROSS TALK | NO RESISTIVE LAYER | D = 0 | D = 0.25 | D = 0.5 |
|---|---|---|---|---|
| TOTAL SUM OF S31 | −20486 | −20699 | −25543 | −30903 |
| DIFFERENCE | 0 | −213 | −5057 | −10417 |

TABLE 6

| FAR-END CROSS TALK | NO RESISTIVE LAYER | D = 0 | D = 0.25 | D = 0.5 |
|---|---|---|---|---|
| TOTAL SUM OF S41 | −20325 | −19493 | −24085 | −27585 |
| DIFFERENCE | 0 | 832 | −3760 | −7260 |

(Evaluation)

As for the transmission noise suppressing effect (S21), compared to the results of Example 3 and Comparative Example 3, the transmission noise suppressing effect becomes larger as the gap (Dg) (which is the distance from the end circumference of the ground line close to the signal transmission line) is smaller, that is, the width of the resistive layer is broader in the case where the resistive layer is disposed. As for the frequency feature, the transmission noise suppressing effect becomes larger as the frequency is increased.

The near-end cross talk (S31) and the far-end cross talk (S41) show the same results. When the gap (Dg) is 0 mm, the result is nearly the same as that of Comparative Example 3 where the resistive layer is not provided. When the gap (Dg) of the gap is 0.25 mm or more, the cross talk is further suppressed, compared to Comparative Example 3 where the resistive layer is not provided.

INDUSTRIAL APPLICABILITY

It is useful industrially to provide the transmission noise suppressing structure capable of suppressing the high-frequency noise in information processing apparatuses, communication apparatuses, and the like, which are packaged with high density, particularly, in the vicinity of an optical module or a power supply such as a CPU of a workstation, a cellular phone, or a game console, without deteriorating the signal quality of the signal transmission line formed in the vicinity thereof.

What is claimed is:

1. A transmission noise suppressing structure comprising:
a power supply line and a signal transmission line which are disposed apart from each other on a same surface;
a ground layer which is disposed apart from said power supply line and said signal transmission line so as to face said power supply line and said signal transmission line; and
a resistive layer which is disposed apart from said power supply line and said ground layer so as to face said power supply line and said ground layer, wherein said resistive layer has an area (I) which faces said power supply line and an area (II) which does not face said power supply line, and said resistive layer and said signal transmission line are apart from each other in a width direction of said power supply line, wherein a width W1 of said power supply line in the width direction of said power supply line and a width W2 of said resistive layer in the width direction of said power supply line satisfy Expression (1-1), $$W1 < W2 \quad (1\text{-}1).$$

2. The transmission noise suppressing structure according to claim 1, wherein a width D of a gap between said resistive layer and said signal transmission line in the width direction of said power supply line, a distance T between said power supply line and said resistive layer in a thickness direction of said power supply line, the width W1 of said power supply line, and a distance L between said power supply line and said signal transmission line in the width direction of said power supply line satisfy Expression (3), $$3T \leq D < (L + W1) \quad (3).$$

3. The transmission noise suppressing structure according to claim 1, wherein said resistive layer is disposed between said power supply line and said ground layer, and a distance T between said power supply line and said resistive layer in a thickness direction of said power supply line and a distance Tg between said ground layer and said resistive layer in the thickness direction of said power supply line satisfy Expression (4), $$T < Tg \quad (4).$$

4. The transmission noise suppressing structure according claim 1, wherein a distance T between said power supply line and said resistive layer in a thickness direction of said power supply line is in a range from 2 to 100 μm.

5. The transmission noise suppressing structure according to claim 1, wherein said resistive layer is a layer formed by a physical vapor deposition and having a thickness of 5 to 300 nm.

6. A wiring circuit board comprising: said transmission noise suppressing structure according to claim 1.

7. A transmission noise suppressing structure comprising:

a power supply line and a signal transmission line which are disposed apart from each other on a same surface;

a ground layer which is disposed apart from said power supply line and said signal transmission line so as to face said power supply line and said signal transmission line; and a resistive layer which is disposed apart from said power supply line and said ground layer so as to face said power supply line and said ground layer, wherein said resistive layer has an area (I) which faces said power supply line and an area (II) which does not face said power supply line, and said resistive layer and said signal transmission line are apart from each other in a width direction of said power supply line, wherein a width W1 of said power supply line in the width direction of said power supply line and a width W2 of said resistive layer in the width direction of said power supply line satisfy Expression (1-2), $$W1 \geq W2 \quad (1\text{-}2).$$

8. The transmission noise suppressing structure according to claim 7, wherein a width D of a gap between said resistive layer and said signal transmission line in the width direction of said power supply line, a distance T between said power supply line and said resistive layer in a thickness direction of said power supply line, the width W1 of said power supply line, and a distance L between said power supply line and said signal transmission line in the width direction of said power supply line satisfy Expression (3), $$3T \leq D < (L + W1) \quad (3).$$

9. The transmission noise suppressing structure according to claim 7, wherein said resistive layer is disposed between said power supply line and said ground layer, and a distance T between said power supply line and said resistive layer in a thickness direction of said power supply line and a distance Tg between said ground layer and said resistive layer in the thickness direction of said power supply line satisfy Expression (4), $$T < Tg \quad (4).$$

10. The transmission noise suppressing structure according claim 7, wherein a distance T between said power supply line and said resistive layer in a thickness direction of said power supply line is in a range from 2 to 100 μm.

11. The transmission noise suppressing structure according to claim 7, wherein said resistive layer is a layer formed by a physical vapor deposition and having a thickness of 5 to 300 nm.

12. A wiring circuit board comprising: said transmission noise suppressing structure according to claim 7.

13. A transmission noise suppressing structure comprising:

a power supply line and a signal transmission line which are disposed apart from each other on a same surface;

a ground layer which is disposed apart from said power supply line and said signal transmission line so as to face said power supply line and said signal transmission line; and a resistive layer which is disposed apart from said power supply line and said ground layer so as to face said power supply line and said ground layer, wherein said resistive layer has an area (I) which faces said power supply line and an area (II) which does not face said power supply line, and said resistive layer and said signal transmission line are apart from each other in a width direction of said power supply line, the transmission noise suppressing structure further comprising:

a ground line which is disposed between said power supply line and said signal transmission line adjacent to each other, wherein a width D of a gap between said resistive layer and said signal transmission line in the width direction of said power supply line and an inter-line distance L2 between said ground line and said signal transmission line in the width direction of said power supply line satisfy Expression (2), $$D > L2 \quad (2).$$

14. The transmission noise suppressing structure according to claim 13, wherein the width D of the gap between said resistive layer and said signal transmission line in the width direction of said power supply line, a distance T between said power supply line and said resistive layer in a thickness direction of said power supply line, the width W1 of said power supply line, and a distance L between said power supply line and said signal transmission line in the width direction of said power supply line satisfy Expression (3), $$3T \leq D < (L+W1) \tag{3}$$

15. The transmission noise suppressing structure according to claim 13, wherein
    said resistive layer is disposed between said power supply line and said ground layer, and
    a distance T between said power supply line and said resistive layer in a thickness direction of said power supply line and a distance Tg between said ground layer and said resistive layer in the thickness direction of said power supply line satisfy Expression (4), $$T < Tg \tag{4}$$

16. The transmission noise suppressing structure according claim 13, wherein a distance T between said power supply line and said resistive layer in a thickness direction of said power supply line is in a range from 2 to 100 μm.

17. The transmission noise suppressing structure according to claim 13, wherein said resistive layer is a layer formed by a physical vapor deposition and having a thickness of 5 to 300 nm.

18. A wiring circuit board comprising: said transmission noise suppressing structure according to claim 13.

* * * * *

UNITED STATES PATENT AND TRADEMARK OFFICE
CERTIFICATE OF CORRECTION

PATENT NO.         : 8,416,029 B2
APPLICATION NO. : 12/671304
DATED              : April 9, 2013
INVENTOR(S)        : Kawaguchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 460 days.

Signed and Sealed this
First Day of September, 2015

Michelle K. Lee
*Director of the United States Patent and Trademark Office*